United States Patent
Xiao et al.

(10) Patent No.: US 8,614,487 B2
(45) Date of Patent: Dec. 24, 2013

(54) SPLIT DUAL GATE FIELD EFFECT TRANSISTOR

(75) Inventors: Deyuan Xiao, Shanghai (CN); Gary Chen, Shanghai (CN); Tan Leong Seng, Shanghai (CN); Roger Lee, Shanghai (CN)

(73) Assignees: Semiconductor Manufacturing International (Shanghai) Corporation, Shanghai (CN); Semiconductor Manufacturing International (Beijing) Corporation, Beijing (CN)

( * ) Notice: Subject to any disclaimer, the term of this patent is extended or adjusted under 35 U.S.C. 154(b) by 30 days.

(21) Appl. No.: 11/377,936

(22) Filed: Mar. 15, 2006
(Under 37 CFR 1.47)

(65) Prior Publication Data

US 2007/0181917 A1  Aug. 9, 2007

(30) Foreign Application Priority Data

Feb. 6, 2006  (CN) .......................... 2006 1 0023748

(51) Int. Cl.
  *H01L 29/66*  (2006.01)
(52) U.S. Cl.
  USPC ............ 257/365; 257/270; 257/E27.028; 257/E29.264; 257/E29.275
(58) Field of Classification Search
  USPC .......... 257/270, 365, E27.028, E29.006, 257/E29.264, E29.275; 438/279, 283
  See application file for complete search history.

(56) References Cited

U.S. PATENT DOCUMENTS

| 4,047,199 A | * | 9/1977 | Kataoka et al. .................. 257/8 |
| 4,063,273 A | * | 12/1977 | Mueller ........................ 326/103 |
| 5,442,209 A | * | 8/1995 | Chung ........................... 257/270 |
| 5,691,215 A | * | 11/1997 | Dai et al. ....................... 438/305 |

(Continued)

FOREIGN PATENT DOCUMENTS

| CN | 2038669 U | 5/1988 | |
| CN | 2038669 | * 5/1989 | ............. H01L 29/78 |
| CN | 1198008 A | 11/1998 | |

OTHER PUBLICATIONS

Benjamin Iniguez et al., Modeling and Simulation of Single- and Multiple-Gate 2-D MESFET's, Aug. 1999, IEEE Transactions on Electronic Devices, vol. 46, No. 8, pp. 1742-1748.*

(Continued)

*Primary Examiner* — S. V. Clark
*Assistant Examiner* — Jesse Y Miyoshi
(74) *Attorney, Agent, or Firm* — Kilpatrick Townsend and Stockton LLP

(57) ABSTRACT

A semiconductor device with at least two gate regions. The device includes a substrate region including a surface, a source region in the substrate region, and a drain region in the substrate region. The drain region and the source region are separate from each other. Additionally, the device includes a first gate region on the surface, a second gate region on the surface, and an insulation region on the surface and between the first gate region and the second gate region. The first gate region and the second gate region are separated by the insulation region. The first gate region is capable of forming a first channel in the substrate region. The first channel is from the source region to the drain region. The second gate region is capable of forming a second channel in the substrate region. The second channel is from the source region to the drain region.

24 Claims, 25 Drawing Sheets

(56) References Cited

U.S. PATENT DOCUMENTS

| | | | |
|---|---|---|---|
| 5,751,033 A * | 5/1998 | Miya | 257/270 |
| 5,828,079 A * | 10/1998 | Mizuno et al. | 257/39 |
| 5,885,887 A * | 3/1999 | Hause et al. | 438/564 |
| 5,923,067 A * | 7/1999 | Voldman | 257/349 |
| 5,998,842 A * | 12/1999 | Sano | 257/366 |
| 6,548,870 B1 * | 4/2003 | Lee | 257/365 |
| 6,689,650 B2 * | 2/2004 | Gambino et al. | 438/157 |
| 6,714,456 B1 * | 3/2004 | Ogura et al. | 365/185.28 |
| 7,199,434 B2 * | 4/2007 | Li et al. | 257/421 |
| 7,279,740 B2 * | 10/2007 | Bhattacharyya et al. | 257/324 |
| 7,582,517 B2 | 9/2009 | Xiao et al. | |
| 8,324,689 B2 * | 12/2012 | Do et al. | 257/365 |
| 2005/0121700 A1 | 6/2005 | Li et al. | |
| 2006/0008964 A1 | 1/2006 | Mineji | |
| 2006/0154424 A1 | 7/2006 | Yang et al. | |
| 2006/0270239 A1 * | 11/2006 | Triyoso et al. | 438/706 |
| 2010/0087040 A1 | 4/2010 | Xiao et al. | |

OTHER PUBLICATIONS

Peatman et al., Two-Dimensional Metal-Semiconductor Field Effect Transistor for Ultra Low Power Circuit Applications, Jul. 1994, IEEE Electron Device Letters, vol. 15, No. 7, pp. 245-247.*
Notice of Allowance for U.S. Appl. No. 11/377,236, mailed on Apr. 27, 2009, 8 pages.
Non-Final Office Action for U.S. Appl. No. 11/377,236, mailed on Dec. 24, 2008, 4 pages.
Non-Final Office Action for U.S. Appl. No. 11/377,236, mailed on Apr. 24, 2008, 11 pages.
Office Action of Chinese Application No. 200610023748.9, dated Jan. 29, 2010, 8 pages total (English translation not included).
Requirement for Restriction/Election for U.S. Appl. No. 11/377,236, mailed on Feb. 25, 2008, 5 pages.
Non-Final Office Action for U.S. Appl. No. 12/549,192, mailed on Feb. 18, 2011, 5 pages.
Notice of Allowance for U.S. Appl. No. 12/549,192, mailed on Aug. 15, 2011, 5 pages.

* cited by examiner

3300

| Process Step Sequence Number | PROCESS STEP DESCRIPTION |
|---|---|
| 1 | WAFER START |
| 2 | WAFER MARK |
| 3 | WAFER SCRUBBER |
| 4 | OXIDE REMOVE |
| 5 | ACTIVE AREA OXIDE PRECLN |
| 6 | ACTIVE AREA PAD OXIDE |
| 7 | ACTIVE AREA NITRIDE |
| 8 | ACTIVE AREA NITRIDE DEPOSITION SCRUB |
| 9 | ACTIVE AREA SION DEPOSITION |
| 10 | ACTIVE AREA SION DEPOSITION SCRUB |
| 11 | ACTIVE AREA PHOTO(DUV) |
| 12 | ACTIVE AREA CD-PHOTO |
| 13 | ACTIVE AREA ETCH |
| 14 | ACTIVE AREA ASHER |
| 15 | ACTIVE AREA ETCH POLYMER & WET STRIP |
| 16 | ACTIVE AREA POST ETCH SC1 CLEAN |
| 17 | ACTIVE AREA CD-ETCH |
| 18 | ACTIVE AREA ETCH LEICA SEM REVIEW |
| 19 | STI PAD OXIDE PRECLN |
| 20 | STI LINING OXIDE |
| 21 | STI HDP OXIDE DEPOSITION |
| 22 | RTA PRECLN |
| 23 | STI RTA |
| 24 | REVERSE TONE PHOTO |
| 25 | REVERSE TONE OVERLAY |
| 26 | REVERSE TONE ETCH |
| 27 | REVERSE TONE ASHER |
| 28 | REVERSE TONE WET STRIP |
| 29 | STI CMP |
| 30 | ACTIVE AREA NITRIDE STRIP |
| 31 | STI PAD OXIDE Remove |
| 32 | SACRIFICE OXIDE PRECLN |
| 33 | SACRIFICE OXIDE |
| 34 | PWELL PHOTO |
| 35 | PWELL OVERLAY |
| 36 | PWELL IMPLANT |
| 37 | NCHANNEL IMPLANT |
| 38 | VTN IMPLANT |
| 39 | PWELL ASHER |
| 40 | PWELL WET STRIP |
| 41 | NWELL PHOTO |
| 42 | NWELL OVERLAY |
| 43 | NWELL IMPLANT |
| 44 | PCHANNEL IMPLANT |
| 45 | VTP IMPLANT |
| 46 | NWELL ASHER |
| 47 | NWELL WET STRIP |
| 48 | NWELL ANNEA PRECLN |
| 49 | NWLL ANNEAL |
| 50 | SACRIFICE OXIDE REMOVE |
| 51 | GATE OXIDE PRECLN |
| 52 | GATE OXIDE |
| 53 | POLY DEPOSITION |
| 54 | POLY DEPOSITION SCRUB |
| 55 | SION COATING |
| 56 | SION SCRUB |
| 57 | GATE PHOTO |
| 58 | GATE OVERLAY |
| 59 | GATE CD-PHOTO |
| 60 | HARD BAKE |
| 61 | POLY ARC ETCH |
| 62 | POLY HARD MASK CD-ETCH |
| 63 | POLY ETCH |
| 64 | GATE ASHER |
| 65 | GATE WET STRIP |
| 66 | POLY ETCH LEICA SEM REVIEW |
| 67 | GATE CD-ETCH |
| 68 | SION REMOVE |
| 69 | GATE RE-OXIDE PRECLN |
| 70 | GATE REOXIDEIDATION |
| 71 | NLDD PHOTO |
| 72 | NLDD OVERLAY |
| 73 | NLDD CD-PHOTO |
| 74 | NPOCKET IMPLANT |
| 75 | NLDD IMPLANT |
| 76 | NLDD ASHER |
| 77 | NLDD WET STRIP |
| 78 | PLDD PHOTO |
| 79 | PLDD OVERLAY |
| 80 | PLDD CD-PHOTO |
| 81 | PPOCKET IMPLANT |
| 82 | PLDD IMPLANT |
| 83 | PLDD ASHER |
| 84 | PLDD WET STRIP |
| 85 | TEOS DEPOSITION PRECLN |
| 86 | LINING TEOS |
| 87 | SIN SPACER |
| 88 | COMPOSITE TEOS SPACER |
| 89 | SPACER ETCH |

| 90 | SPACER POST CLN |
|---|---|
| 91 | SPACER ETCH LEICA SEM REVIEW |
| 92 | OXIDE STRIP |
| 93 | N+ PHOTO |
| 94 | N+ OVERLAY |
| 95 | N+ CD-PHOTO |
| 96 | N+ IMPLANT1 |
| 97 | N+ IMPLANT2 |
| 98 | N+ ASHER |
| 99 | N+ WET STRIP |
| 100 | N+ SC1 |
| 101 | N+ RTA ANNEAL |
| 102 | P+ PHOTO |
| 103 | P+ OVERLAY |
| 104 | P+ CD-PHOTO |
| 105 | P+ IMPLANT1 |
| 106 | P+ IMPLANT2 |
| 107 | P+ ASHER |
| 108 | P+ WET STRIP |
| 109 | P+ SC1 |
| 110 | SPLIT GATE PHOTO |
| 111 | SPLIT GATE OVERLAY |
| 112 | SPLIT GATE PHOTO CD |
| 113 | HARD BAKE |
| 114 | SPLIT GATE ETCH |
| 115 | SPLIT GATE ETCH CD |
| 116 | SPLIT GATE ASHER |
| 117 | SPLIT GATE WET STRIP |
| 118 | SALICIDE BLOCK CAP OXIDE PRE CLN |
| 119 | SALICIDE BLOCK CAP OXIDE |
| 120 | P+ RTA |
| 121 | SALICIDE BLOCK PHOTO |
| 122 | SALICIDE BLOCK OVERLAY |
| 123 | SALICIDE BLOCK DRY ETCH |
| 124 | SALICIDE BLOCK WET ETCH |
| 125 | ASHER |
| 126 | PR STRIP |
| 127 | SALICIDE BLOCK WET STRIP +SC1 |
| 128 | SALICIDE PRE-OXIDE REMOVE |
| 129 | SALICIDE CO DEPOSITION (CO75A+TiN200A) |
| 130 | SALICIDE RTA1 COSI |

| 131 | SALICIDE SELECTIVE CO/TiN REMOVE |
|---|---|
| 132 | SALICIDE RTA2 COSI |
| 133 | SALICIDE RTA LEICA SEM REVIEW |
| 134 | SION COATING |
| 135 | SION Scrubber |
| 136 | ILD BPTEOS |
| 137 | ILD BPTEOS REFLOW |
| 138 | CR CLEAN |
| 139 | PETEOS DEPOSITION |
| 140 | ILD CMP |
| 141 | ILD CR CLN |
| 142 | SION DEPOSITION |
| 143 | WAFER SCRUBBER |
| 144 | CONTACT DUV PHOTO |
| 145 | CONTACT OVERLAY |
| 146 | CONTACT OVERLAY (To Poly) |
| 147 | CONTACT CD-PHOTO |
| 148 | CONTACT ETCH |
| 149 | CONTACT ASHER |
| 150 | CONTACT WET STRIP |
| 151 | CONTACT TI/TIN |
| 152 | CONTACT TI ANNEAL |
| 153 | CONTACT SPUT LEICA SEM REVIEW |
| 154 | CONTACT W DEPOSITION (3300+-330A) |
| 155 | CONTACT W CMP |
| 156 | MET1 DEPOSITION |
| 157 | SCRUB CLEAN AFTER AlCu/TiN DEPOSITION |
| 158 | SION DEPOSITION |
| 159 | SCRUB CLEAN AFTER SION DEPOSITION |
| 160 | METAL1 PHOTO |
| 161 | METAL1 OVERLAY |
| 162 | METAL1 CD-PHOTO |
| 163 | HARD BAKE |
| 164 | METAL1 ETCH WITH ARC |
| 165 | METAL1 WET STRIP |
| 166 | METAL1 CD-ETCH |
| 167 | METAL1 ETCH LEICA SEM REVIEW |
| 168 | PURE H2 ALLOY |

FIGURE 29(B)

SPLIT DUAL GATE FIELD EFFECT TRANSISTOR

CROSS-REFERENCES TO RELATED APPLICATIONS

This application claims priority to Chinese Patent Application No. 200610023748.9, filed Feb. 6, 2006, commonly assigned, incorporated by reference herein for all purposes.

The following two commonly-owned co-pending applications, including this one, are being filed concurrently and the other one is hereby incorporated by reference in its entirety for all purposes:

1. U.S. patent application Ser. No. 12/549,192, filed Aug. 27, 2011 in the name of Deyuan Xiao, Gary Chen, Tan Leong Seng, and Roger Lee, titled, "Method for Making Split Dual Gate Field Effect Transistor,"; and 2. U.S. patent application Ser. No. 11/377,236, filed Mar. 16, 2006 in the name of Deyuan Xiao, Gary Chen, Tan Leong Seng, and Roger Lee, titled, "Method for Making Split Dual Gate Field Effect Transistor,", now U.S. Pat. No. 7,582,517 B2.

STATEMENT AS TO RIGHTS TO INVENTIONS MADE UNDER FEDERALLY SPONSORED RESEARCH OR DEVELOPMENT

NOT APPLICABLE

REFERENCE TO A "SEQUENCE LISTING," A TABLE, OR A COMPUTER PROGRAM LISTING APPENDIX SUBMITTED ON A COMPACT DISK

NOT APPLICABLE

BACKGROUND OF THE INVENTION

The present invention is directed to integrated circuits. More particularly, the invention provides a split dual gate field effect transistor. Merely by way of example, the invention has been applied to a logic system. But it would be recognized that the invention has a much broader range of applicability.

Integrated circuits or "ICs" have evolved from a handful of interconnected devices fabricated on a single chip of silicon to millions of devices. Current ICs provide performance and complexity far beyond what was originally imagined. In order to achieve improvements in complexity and circuit density (i.e., the number of devices capable of being packed onto a given chip area), the size of the smallest device feature, also known as the device "geometry", has become smaller with each generation of ICs. Semiconductor devices are now being fabricated with features less than a quarter of a micron across.

Increasing circuit density has not only improved the complexity and performance of ICs but has also provided lower cost parts to the consumer. An IC fabrication facility can cost hundreds of millions, or even billions, of dollars. Each fabrication facility will have a certain throughput of wafers, and each wafer will have a certain number of ICs on it. Therefore, by making the individual devices of an IC smaller, more devices may be fabricated on each wafer, thus increasing the output of the fabrication facility. Making devices smaller is very challenging, as a given process, device layout, and/or system design often work down to only a certain feature size.

An example of such a limit is how to reduce the transistor leakage current and improve the transistor drive current. For example, reducing the source-drain voltage of a transistor can lower the active power, but doing so often reduces the transistor drive current. The transistor drive current can be improved by reducing the threshold voltage and thinning the gate dielectric, but such actions often raise the transistor leakage current.

From the above, it is seen that an improved transistor structure is desired.

BRIEF SUMMARY OF THE INVENTION

The present invention is directed to integrated circuits. More particularly, the invention provides a split dual gate field effect transistor. Merely by way of example, the invention has been applied to a logic system. But it would be recognized that the invention has a much broader range of applicability.

In a specific embodiment, the invention provides a semiconductor device with at least two gate regions. The device includes a substrate region including a surface, a source region in the substrate region, and a drain region in the substrate region. The drain region and the source region are separate from each other. Additionally, the device includes a first gate region on the surface, a second gate region on the surface, and an insulation region on the surface and between the first gate region and the second gate region. The first gate region and the second gate region are separated by the insulation region. The first gate region is capable of forming a first channel in the substrate region. The first channel is from the source region to the drain region. The second gate region is capable of forming a second channel in the substrate region. The second channel is from the source region to the drain region.

According to another embodiment, a semiconductor transistor with at least two gate regions includes a substrate region including a surface, a source region in the substrate region, and a drain region in the substrate region. The drain region and the source region are separate from each other. Additionally, the transistor includes a first gate region on the surface, a second gate region on the surface, and an insulation region on the surface and between the first gate region and the second gate region. Moreover, the transistor includes a first spacer region. The first spacer region is in contact with the first gate region, the second gate region, and the insulation region. Also, the transistor includes a second spacer region. The second spacer region is in contact with the first gate region, the second gate region, and the insulation region. The first gate region and the second gate region are separated by the insulation region. The first gate region is capable of forming a first channel from the source region to the drain region in the substrate region, and the second gate region is capable of forming a second channel from the source region to the drain region in the substrate region. The first channel and the second channel are not in contact to each other.

According to yet another embodiment, a transistor with at least two gate regions includes a substrate region including a surface, a source region in the substrate region, and a drain region in the substrate region. The drain region and the source region are separate from each other. Additionally, the transistor includes a first gate region on the surface, a second gate region on the surface, and an insulation region on the surface and between the first gate region and the second gate region. Moreover, the transistor includes a first spacer region. The first spacer region is in contact with the first gate region, the second gate region, and the insulation region. Also, the transistor includes a second spacer region. The second spacer region is in contact with the first gate region, the second gate region, and the insulation region. The first gate region and the second gate region are separated by the insulation region. The first gate region is capable of forming a first channel from the source region to the drain region in the substrate region, and the second gate region is capable of forming a second channel from the source region to the drain region in the substrate region. The first channel and the second channel are not in contact to each other. The first channel is associated with a first channel length, the first channel length being equal to or shorter than 200 nm. The insulation region is associated with a width in a direction from the first gate region to the second gate region, and the width ranges from 10 nm to 10,000 nm.

Many benefits are achieved by way of the present invention over conventional techniques. Some embodiments of the present invention provide a new planar split dual gate transistor device. Certain embodiments of the present invention provide dual gates that can be biased independently. For example, the independent gate biases can provide dynamical control of the device characteristics such as threshold voltage, sub-threshold swing, and/or the saturation drain current. Some embodiments of the present invention can significantly reduce transistor leakage current. For example, the reduction can reach about 67%. In another example, the reduction can reach about 75%. Certain embodiments of the present invention can provide adjustable threshold voltage without varying gate oxide thickness or doping profile. Some embodiments of the present invention provide an energy band that varies along all three dimensions.

Various additional objects, features and advantages of the present invention can be more fully appreciated with reference to the detailed description and accompanying drawings that follow.

BRIEF DESCRIPTION OF THE DRAWINGS

FIGS. 29(A) and (B) show a simplified method for making split dual gate field effect transistor according to another embodiment of the present invention;

DETAILED DESCRIPTION OF THE INVENTION

The present invention is directed to integrated circuits. More particularly, the invention provides a split dual gate field effect transistor. Merely by way of example, the invention has been applied to a logic system. But it would be recognized that the invention has a much broader range of applicability.

Figure 1:
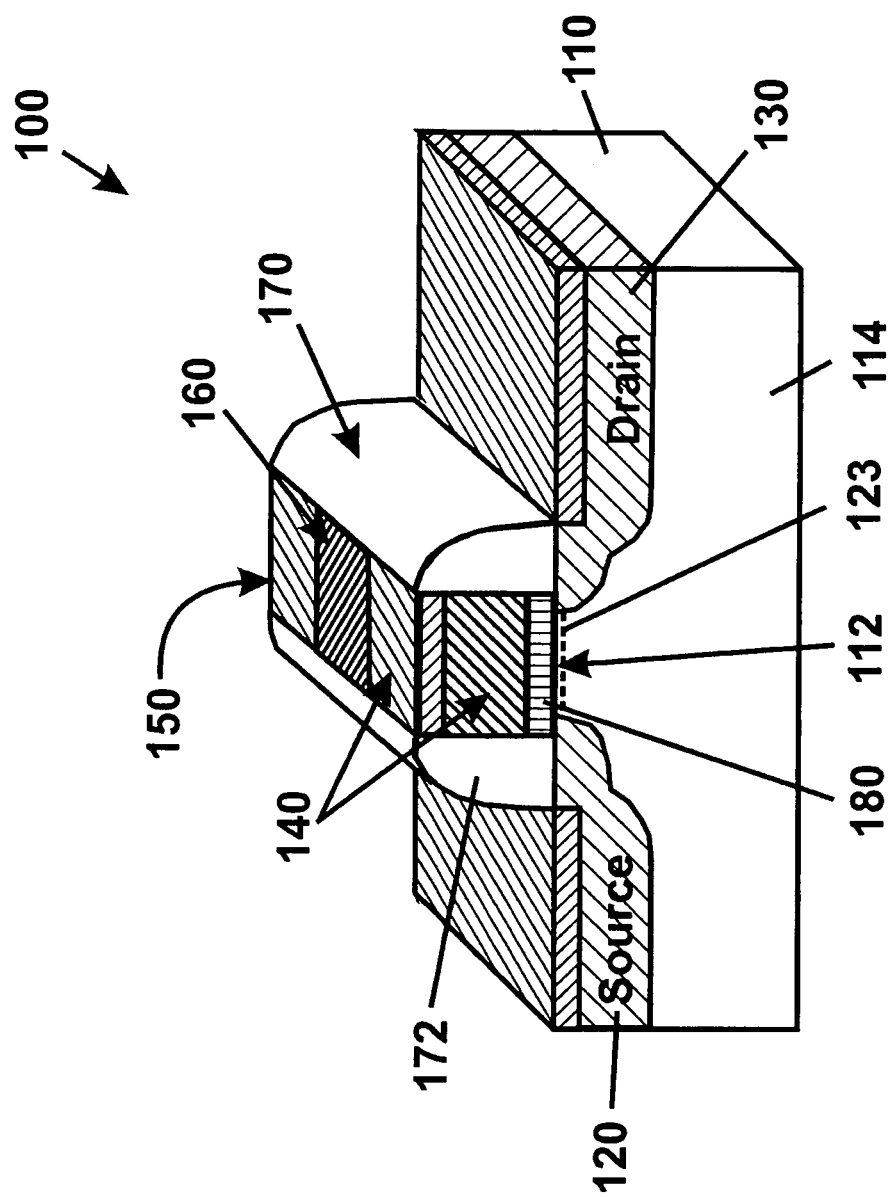
FIG. 1 is a simplified diagram for split dual gate field effect transistor according to an embodiment of the present invention.

FIG. 1 is a simplified diagram for split dual gate field effect transistor according to an embodiment of the present invention. This diagram is merely an example, which should not unduly limit the scope of the claims. One of ordinary skill in the art would recognize many variations, alternatives, and modifications. The device 100 includes the following components:

1. Substrate region 110;
2. Source region 120;
3. Drain region 130;
4. Gate regions 140 and 150;
5. Insulation region 160;
6. Spacer regions 170 and 172;
7. Gate dielectric region 180.

Although the above has been shown using a selected group of components for the device 100, there can be many alternatives, modifications, and variations. For example, some of the components may be expanded and/or combined. Other components may be inserted to those noted above. Depending upon the embodiment, the arrangement of components may be interchanged with others replaced. For example, the device 100 is an NMOS transistor. In another example, the device 100 is a PMOS transistor. Further details of these components are found throughout the present specification and more particularly below.

In one embodiment, the substrate region 110 is made of a semiconductor material. For example, the semiconductor material is silicon. The semiconductor substrate region 110 is intrinsic or doped to p-type or n-type. For example, the substrate region 110 is doped to p-type, with a dopant concentration ranging from $1.0\times10^{15}$ cm$^{-3}$ to $2.0\times10^{15}$ cm$^{-3}$. In another example, the substrate region 110 is doped to n-type, with a dopant concentration ranging from $1.0\times10^{15}$ cm$^{-3}$ to $2.0\times10^{15}$ cm$^{-3}$.

The source region 120 and the drain region 130 are doped to n-type or p-type. For example, the source region 120 is doped to n-type with a dopant concentration ranging from $1.0\times10^{18}$ cm$^{-3}$ to $1.0\times10^{19}$ cm$^{-3}$, and the drain region 130 is doped to n-type with a dopant concentration ranging from $1.0\times10^{18}$ cm$^{-3}$ to $1.0\times10^{19}$ cm$^{-3}$. In another example, the source region 120 is doped to p-type with a dopant concentration ranging from $1.0\times10^{18}$ cm$^{-3}$ to $1.0\times10^{19}$ cm$^{-3}$, and the drain region 130 is doped to p-type with a dopant concentration ranging from $1.0\times10^{18}$ cm$^{-3}$ to $10\times10^{19}$ cm$^{-3}$.

The gate dielectric region 180 is located on the top surface 112 of the substrate region 110. For example, the gate dielectric region 180 is made of silicon oxide, silicon nitride, silicon oxynitride, or any combination thereof. In another example, the gate dielectric region is a dielectric layer. The gate regions 140 and 150 and the insulation region 160 are located on the gate dielectric region 180. For example, the gate regions 140 and 150 each are made of polysilicon. As shown in FIG. 1, the gate regions 140 and 150 are not in direct contact with each other but are separated by the insulation region 160. For example, the insulation region 160 has two side surfaces, one of which is in direct contact with the gate region 140 and the other one of which is in direct contact with the gate region 150. In another example, the insulation region 160 includes a gap, such as an air gap. In yet another example, the insulation region 160 includes silicon oxide, silicon nitride, silicon oxynitride, or any combination thereof. In yet another example, the insulation region 160 includes a salicide block layer (SAB), such as an silicon-rich oxide layer.

The spacer regions 170 and 172 are located on the top surface 112. The spacer region 170 is in direct contact with the gate regions 140 and 150 and the insulation region 160 on one side, and the spacer region 172 is in direct contact with the gate regions 140 and 150 and the insulation region 160 on another side. For example, the spacer regions 170 and 172 each are made of silicon oxide, silicon nitride, silicon oxynitride, or any combination thereof.

Figure 2:
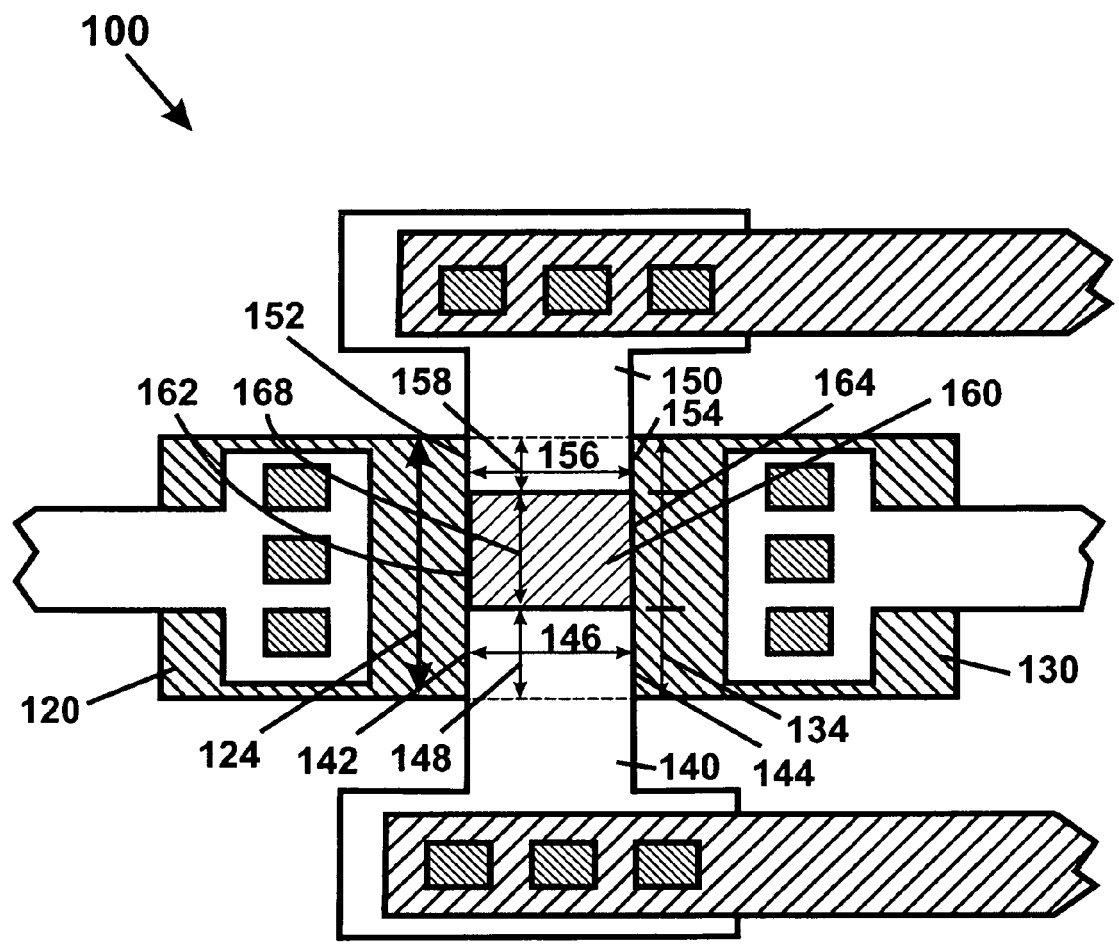
FIG. 2 is a simplified top-view layout diagram for split dual gate field effect transistor according to another embodiment of the present invention.

FIG. 2 is a simplified top-view layout diagram for split dual gate field effect transistor according to another embodiment of the present invention. This diagram is merely an example, which should not unduly limit the scope of the claims. One of ordinary skill in the art would recognize many variations, alternatives, and modifications. The device 100 includes at least the source region 120, the drain region 130, the gate regions 140 and 150, and the insulation region 160. Although the above has been shown using a selected group of components for the device 100, there can be many alternatives, modifications, and variations. For example, some of the components may be expanded and/or combined. Other components may be inserted to those noted above. Depending upon the embodiment, the arrangement of components may be interchanged with others replaced. Further details of these components are found throughout the present specification and more particularly below.

As shown in FIG. 2, the gate regions 140 and 150 are separated by the insulation region 160. The gate regions 140 and 150 and the insulation region 160 form a continuous region, and the continuous region separates the source region 120 and the drain region 130 in the top view. The gate region 140 includes side surfaces 142 and 144, the gate region 150 includes side surfaces 152 and 154, and the insulation region 160 includes side surfaces 162 and 164. For example, the side surfaces 142, 152, and 162 form a continuous surface, and the side surfaces 144, 154, and 164 form another continuous surface. In another example, the source region 120 is aligned with the side surfaces 142, 152, and 162. In yet another example, the drain region 130 is aligned with the side surfaces 144, 154, and 164.

The source region 120 has a width 124, and the drain region 130 has a width 134. For example, the width 124 ranges from 10 nm to 20,000 nm. In another example, the width 134 ranges from 10 nm to 10,000 nm. In one embodiment, the widths 124 and 134 are the same. In another embodiment, the widths 124 and 134 are different. The gate region 140 has a length 146, and the gate region 150 has a length 156. For example, the length 146 ranges from 10 nm to 1,000 nm. In another example, the length 156 ranges from 10 nm to 1,000 nm. In one embodiment, the lengths 146 and 156 are the same. In another embodiment, the lengths 146 and 156 are different. The gate region 140 has a width 148, the gate region 150 has a width 158, and the insulation region 160 has a width 168. For example, the total width for the width 148, the width 158, and the width 168 is equal to the width 124 and/or the width 134. In another example, the width 148 ranges from 10 nm to 15,000 nm. In yet another example, the width 158 ranges from 10 nm to 15,000 nm. In yet another example, the width 168 ranges from 10 nm to 15,000 nm. In yet another example, the width 168 ranges from 10 nm to 10,000 nm. In one embodiment, the widths 148 and 158 are the same. In another embodiment, the widths 148 and 158 are different.

As shown in FIGS. 1 and 2, the gate regions 140 and 150 are physically separated by the insulation region 160 according to an embodiment of the present invention. For example, the gate regions 140 and 150 can be biased to different voltage levels. In another embodiment, the gate region 140 with proper bias can form a channel from the source region 120 to the drain region 130 in the substrate region 110, and the gate region 150 with proper bias can form another channel from the source region 120 to the drain region 130 in the substrate region 110. For example, the channel under the gate region 140 has a length 146, and the channel under the gate region 150 has a length 156.

Figure 3:
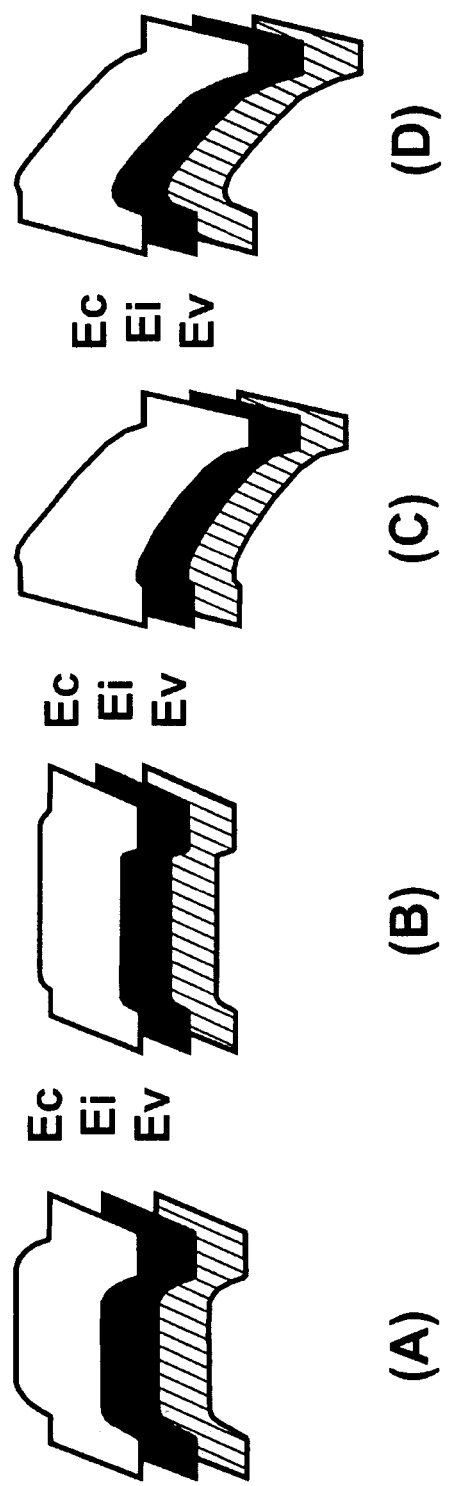
FIGS. 3(A), (B), (C), and (D) are simplified three-dimensional energy-band diagrams for split dual gate field effect transistor according to an embodiment of the present invention.

FIGS. 3(A), (B), (C), and (D) are simplified three-dimensional energy-band diagrams for split dual gate field effect transistor according to an embodiment of the present invention. These diagrams are merely examples, which should not unduly limit the scope of the claims. One of ordinary skill in the art would recognize many variations, alternatives, and modifications. For example, as shown in FIG. 1, the energy-band diagrams describe the energy band along a line 123 between the source region 120 and the drain region 130. In one embodiment, the line 123 is in close proximity and substantially parallel to the top surface 112. In another embodiment, the device 100 is an NMOS transistor, and a bottom surface 114 of the substrate region 110 is biased to zero volt.

FIG. 3(A) shows the energy band in equilibrium with zero volt applied to both the gate region 140 and the gate region 150. The source region 120 and the drain region 130 each are biased also to zero volt. FIG. 3(B) shows the energy band in equilibrium with a non-zero-volt applied to both the gate regions 140 and 150. The source region 120 and the drain region 130 each are biased to zero volt.

FIG. 3(C) shows the energy band in non-equilibrium state with a non-zero-volt bias being applied to the gate regions 140 and 150. The source region 120 is biased to zero volt, and the drain region 130 is biased to non-zero volt. The energy band bends downward from the source region 120 to the drain region 130. FIG. 3(D) shows the energy band in non-equilibrium state with a non-zero-volt bias applied to the gate region 140 and another different non-zero-volt bias applied to the gate region 150. The source region 120 is biased to zero volt, and the drain region 130 is biased to non-zero volt. As shown in FIG. 3(D), the energy band is twisted in a first direction and bends downward in a second direction from the source region 120 to the drain region 130. For example, the first direction is parallel to the widths 148, 158, and 168. In another example, the second direction is parallel to the lengths 146 and 156.

Figure 4:
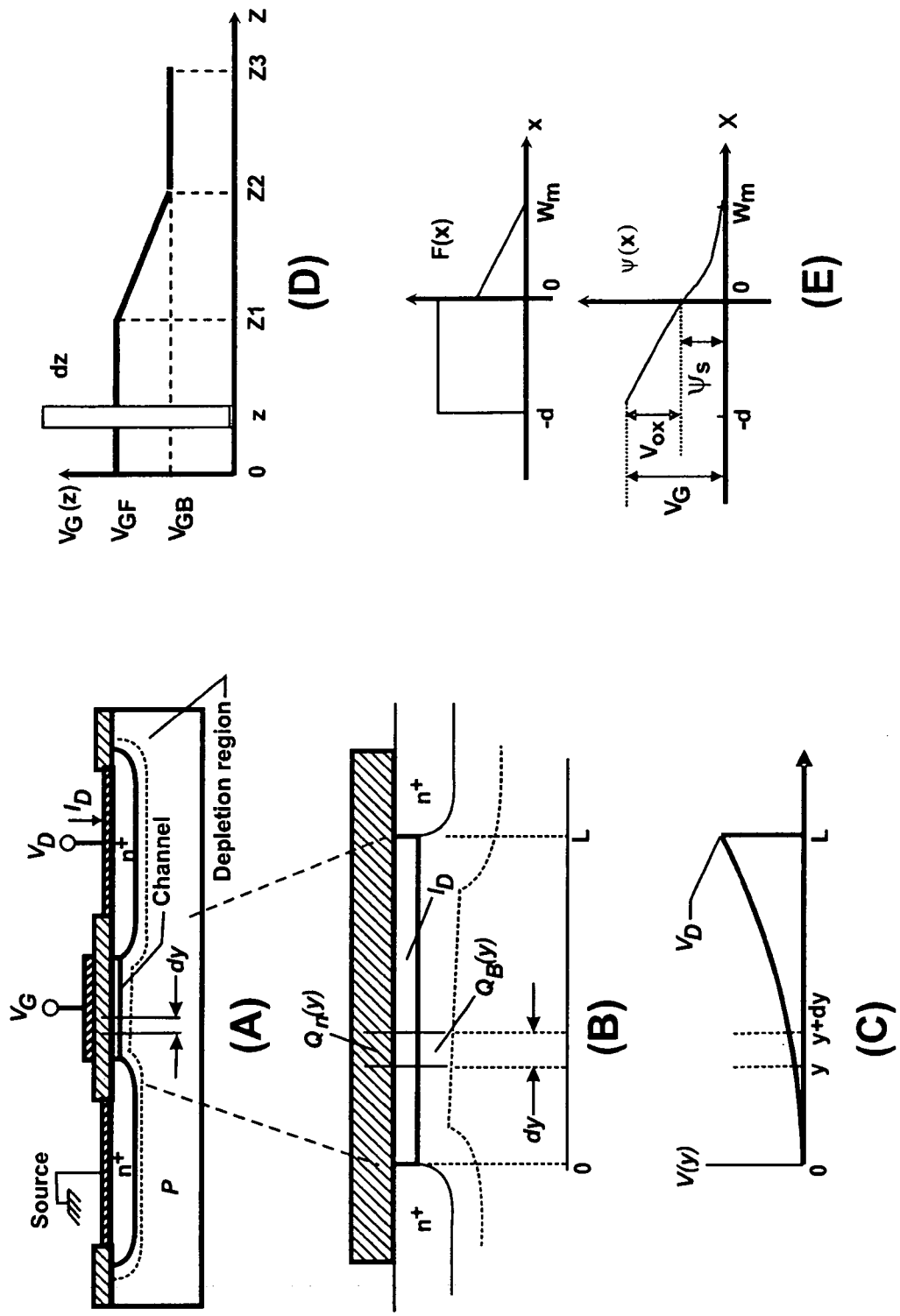
FIGS. 4(A), (B), (C), (D), and (E) are simplified diagrams showing charges, electric field, and potential distribution for split dual gate field effect transistor according to an embodiment of the present invention.

FIGS. 4(A), (B), (C), (D), and (E) are simplified diagrams showing charges, electric field, and potential distribution for split dual gate field effect transistor according to an embodiment of the present invention. These diagrams are merely examples, which should not unduly limit the scope of the claims. One of ordinary skill in the art would recognize many variations, alternatives, and modifications. For example, the split dual gate field effect transistor is the device 100.

To derive certain characteristics of the split dual gate field effect transistor, the following assumptions are made:
1. The gate structure corresponds to an ideal MOS diode;
2. Only drift current is considered;
3. Carrier mobility in the inversion layer is constant;
4. Dopant concentration in the channel region is uniform;
5. Reverse leakage current is negligible;
6. The transverse electric field that is generated by the gate region 140 and/or the gate region 150 and perpendicular to the current flow is much greater than the longitudinal electric field created by the drain region 130 and parallel to the current flow. Accordingly, the gradual channel approximation is used. Charges in the surface depletion region is assumed to be induced only by the transverse electric field.
7. By applying different voltages to the gate regions 140 and 150, the electric field perpendicular to the current flow is not uniform in a direction that is parallel to the widths 148, 158, and 168.

The charge per unit area in the inversion layer is given by:

$$Q_n(y,z) = Q_s(y,z) - Q_{sc}(y,z) \quad \text{(Equation 1)}$$

$$Q_s(y,z) = -[V_G(z) - \psi_s(y)]C \quad \text{(Equation 2)}$$

The surface potential $\psi_s$ for inversion at (y,z) can be approximated as:

$$\psi_s(y) \cong 2\psi_B + V(y) \quad \text{(Equation 3A)}$$

$$Q_{sc}(y,z) = -eN_A W_m \cong -\sqrt{2\varepsilon_s eN_A[2\psi_B + V(y)]} \quad \text{(Equation 3B)}$$

Substituting this into the equation for the charge in the inversion layer, the following can be obtained:

$$Q_n(y,z) = -[V_G(z) - \psi_s(y)]C_0 - Q_{sc}(y,z) \quad \text{(Equation 4)}$$
$$\cong -[V_G(z) - V(y) - 2\psi_B]C_0 + \sqrt{2\varepsilon_s eN_A[2\psi_B + V(y)]}$$

where V(y) is the reverse drain bias at point of (y, z). The conductivity of the channel at a position y is given by:

$$\sigma(x) = en(x)\mu_n(x) \quad \text{(Equation 5)}$$

For a constant mobility, the channel conductance is then $$g = \frac{dz}{L}\int_0^{x_i} \sigma(x)\,dx \quad \text{(Equation 6)}$$
$$= \frac{dz\mu_n}{L}\int_0^{x_i} en(x)\,dx$$
$$= \frac{dz\mu_n}{L}|Q_n|$$

where $Q_n$ is the total charge per unit area in the inversion layer. The resistance of an elemental section of the channel dydz is as follows:

$$dR = \frac{dy}{gL} = \frac{dy}{\mu_n dz|Q_n(y,z)|} \quad \text{(Equation 7)}$$

The voltage drop across the same elemental section dy is, $$dV = I_D dR = \frac{I_D dy}{dz\mu_n |Q_n(y,z)|} \quad \text{(Equation 8)}$$

If the equation for $Q_n(y,z)$ is substitued and integrated from the source region 120 (y=0, V(0)=0) to the drain region 130

(y=L, V(L)=V_D) and from the gate region 140 (z=0) to the gate region (z=W), the total current flow from source to drain can be expressed by:

$$I_D = \frac{1}{L}\mu_n \int_0^z \int_0^{V_D} |Q_n(y,z)| dz dV$$ (Equation 9)

$$= \frac{Z1}{L}\mu_n C_o \left\{ \begin{array}{l} \left(V_{GF} - 2\psi_B - \frac{V_D}{2}\right)V_D - \\ \frac{2}{3}\frac{\sqrt{2\varepsilon_s e N_A}}{C_o}\left[(V_D + 2\psi_B)^{3/2} - (2\psi_B)^{3/2}\right] \end{array} \right\} +$$

$$\frac{Z2}{L}\mu_n C_o \left\{ \begin{array}{l} \frac{1}{2}V_D(V_{GB} + V_{GF}) - \\ \left(2\psi_B + \frac{V_D}{2}\right)V_D - \\ \frac{2}{3}\frac{\sqrt{2\varepsilon_s e N_A}}{C_o}\left[(V_D + 2\psi_B)^{3/2} - (2\psi_B)^{3/2}\right] \end{array} \right\} +$$

$$\frac{Z3}{L}\mu_n C_o \left\{ \begin{array}{l} \left(V_{GF} - 2\psi_B - \frac{V_D}{2}\right)V_D - \\ \frac{2}{3}\frac{\sqrt{2\varepsilon_s e N_A}}{C_o}\left[(V_D + 2\psi_B)^{3/2} - (2\psi_B)^{3/2}\right] \end{array} \right\}$$

where Z1 represents the width 148, Z2 represents the width 168, and Z3 represents the width 158. The sum of Z1, Z2, and Z3 is equal to W. In one embodiment of the present invention, Z1, Z2, and Z3 are equal. Accordingly, Equation 9 can be transformed as follows:

$$I_D = \frac{W-Z2}{2L}\mu_n C_o \left\{ \begin{array}{l} \left(V_{GF} - 2\psi_B - \frac{V_D}{2}\right)V_D - \\ \frac{2}{3}\frac{\sqrt{2\varepsilon_s e N_A}}{C_o}\left[(V_D + 2\psi_B)^{3/2} - (2\psi_B)^{3/2}\right] \end{array} \right\} +$$ (Equation 10)

$$\frac{Z2}{L}\mu_n C_o \left\{ \begin{array}{l} \frac{1}{2}V_D(V_{GB} + V_{GF}) - \\ \left(2\psi_B + \frac{V_D}{2}\right)V_D - \\ \frac{2}{3}\frac{\sqrt{2\varepsilon_s e N_A}}{C_o}\left[(V_D + 2\psi_B)^{3/2} - (2\psi_B)^{3/2}\right] \end{array} \right\} +$$

$$\frac{W-Z2}{2L}\mu_n C_o \left\{ \begin{array}{l} \left(V_{GB} - 2\psi_B - \frac{V_D}{2}\right)V_D - \\ \frac{2}{3}\frac{\sqrt{2\varepsilon_s e N_A}}{C_o}\left[(V_D + 2\psi_B)^{3/2} - (2\psi_B)^{3/2}\right] \end{array} \right\}$$

$$I_D = \frac{W}{L}\mu_n C_o \left\{ \begin{array}{l} \frac{1}{2}V_D(V_{GB} + V_{GF}) - \\ \left(2\psi_B + \frac{V_D}{2}\right)V_D - \\ \frac{2}{3}\frac{\sqrt{2\varepsilon_s e N_A}}{C_o}\left[(V_D + 2\psi_B)^{3/2} - (2\psi_B)^{3/2}\right] \end{array} \right\}$$

Figure 5:
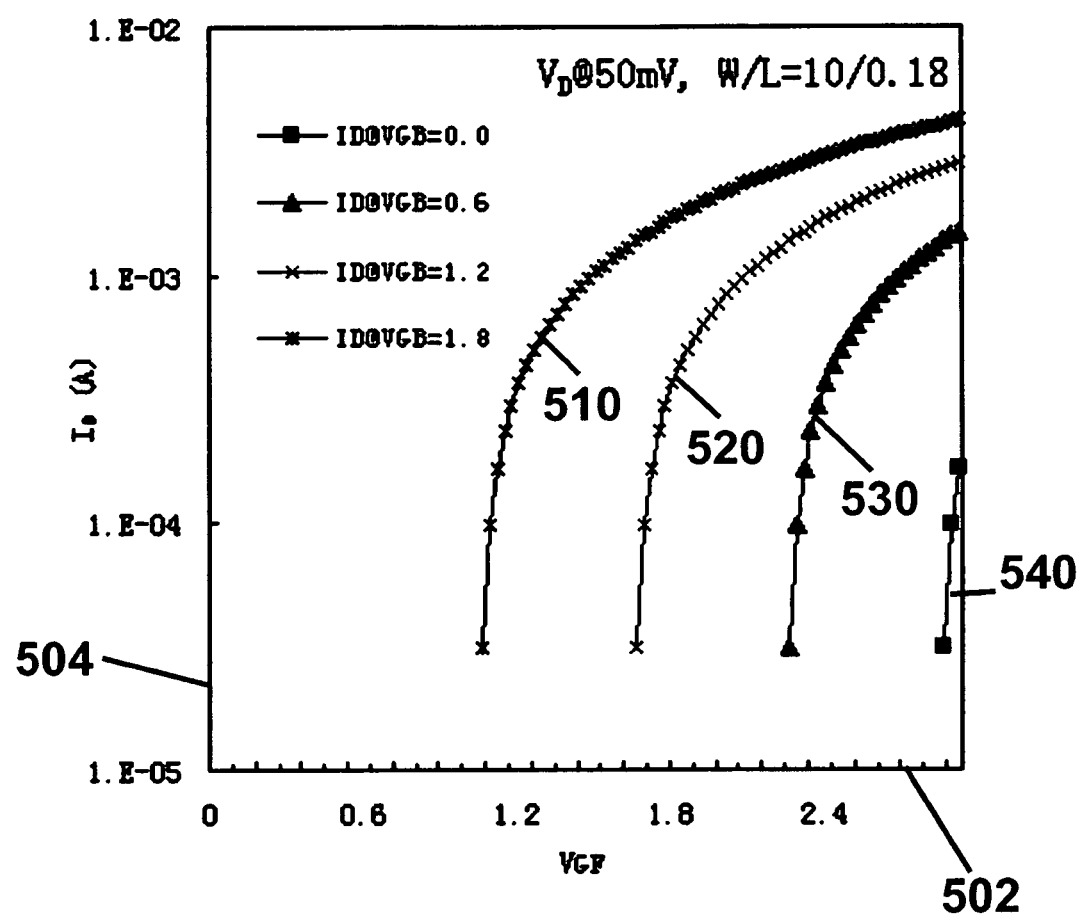
FIG. 5 is a simplified diagram showing drain current as a function of gate biases for split dual gate field effect transistor according to an embodiment of the present invention.

FIG. 5 is a simplified diagram showing drain current as a function of gate biases for split dual gate field effect transistor according to an embodiment of the present invention. This diagram is merely an example, which should not unduly limit the scope of the claims. One of ordinary skill in the art would recognize many variations, alternatives, and modifications.

For example, the split dual gate field effect transistor is the device 100. A horizontal axis 502 represents the voltage applied to the gate region 140, and a vertical axis 504 represents the drain current. The drain region 130 is biased to 50 mV, and the source region 120 and the bottom surface 114 are grounded. The total width of the width 148, the width 158, and the width 168 is equal to about 10 μm, and each of the lengths 146 and 156 is equal to about 0.18 μm. For curves 510, 520, 530, and 540, the gate region 150 is biased to 1.8 volts, 1.2 volts, 0.6 volts, and 0 volt respectively. As an example, the curves 510, 520, 530, and 540 each are determined based on Equation 10.

Figure 6:
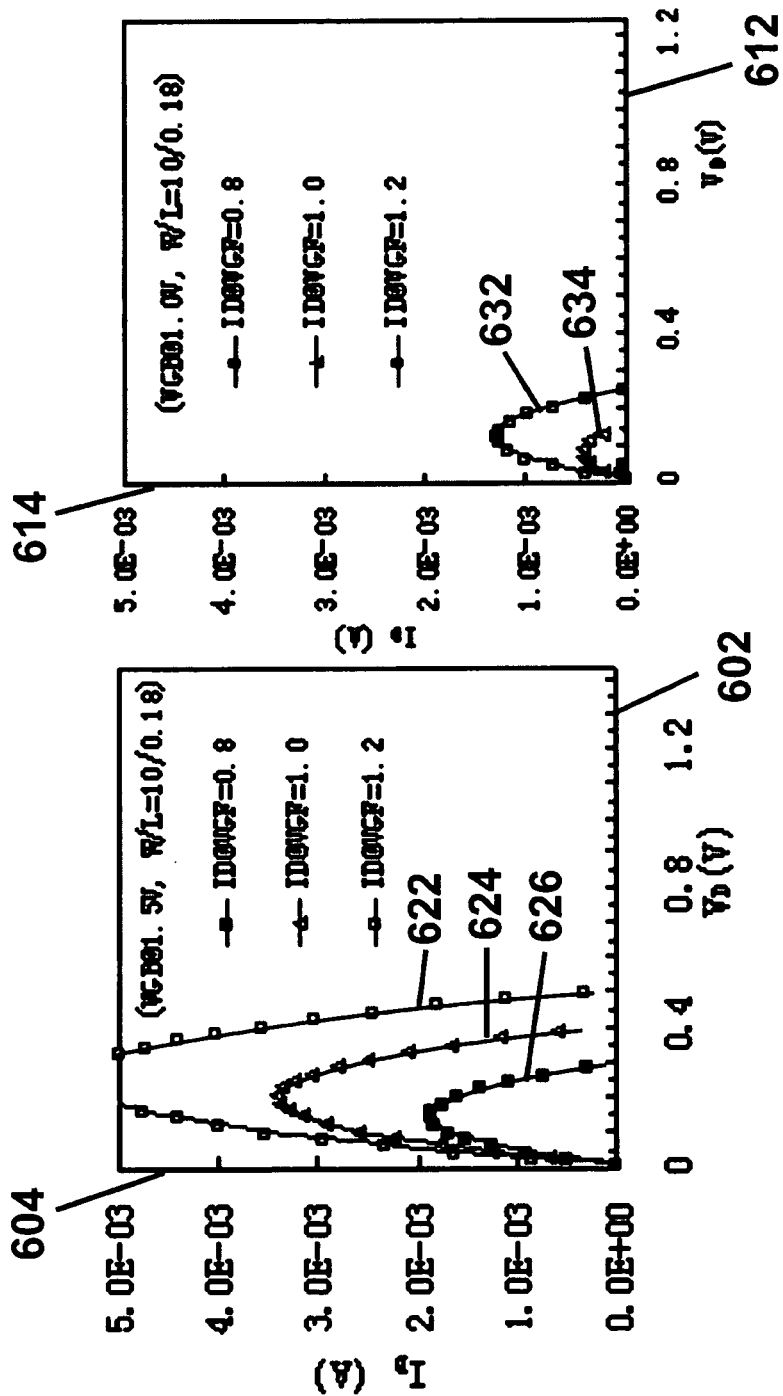
FIG. 6 is a simplified diagram showing drain current as a function of drain bias for split dual gate field effect transistor according to an embodiment of the present invention.

FIG. 6 is a simplified diagram showing drain current as a function of drain bias for split dual gate field effect transistor according to an embodiment of the present invention. This diagram is merely an example, which should not unduly limit the scope of the claims. One of ordinary skill in the art would recognize many variations, alternatives, and modifications.

For example, the split dual gate field effect transistor is the device 100. Horizontal axes 602 and 612 each represent the voltage applied to the drain region 130, and vertical axes 604 and 614 each represent the drain current. The source region 120 and the bottom surface 114 are grounded. The total width of the width 148, the width 158, and the width 168 is equal to about 10 μm, and each of the lengths 146 and 156 is equal to about 0.18 μm. For curves 622, 624, and 626, the gate region 150 is biased to 1.5 volts, and for curves 632 and 634, the gate region 150 is biased to 0 volt. The curves 622, 624, and 626 correspond to 1.2, 1.0, and 0.8 volts respectively, which are applied to the gate region 140. The curves 632 and 634 correspond to 1.2 volts and 1.0 volts respectively, which are applied to the gate region 140. As an example, the curves 622, 624, 626, 632, and 634 each are determined based on Equation 10.

According to an embodiment of the present invention, drifting is assumed to be the dominant transport mechanism for carriers in the charge sheet, and Z1, Z2, and Z3 are assumed to be equal. When the channel regions under both the gate regions 140 and 150 are in weak inversion, $$I_D = \frac{qAD_n n_i \exp\left(\frac{-q\psi_B}{kT}\right)}{L}\left[1 - \exp\left(\frac{-qV_D}{kT}\right)\right]\exp\left(\frac{q\psi_s}{kT}\right)$$ (Equation 11)

where $$\psi_s \cong V_G - V_T, \beta = \frac{q}{kT}.$$

The drain current density $J_D$ is equal to $I_D/A$ as follows:

$$J_D = \int_0^Z i_D dz$$ (Equation 12)

$$= \int_0^{Z_1} i_D dz + \int_{Z_1}^{Z_1+Z_2} i_D dz + \int_{Z_1+Z_2}^{Z_1+Z_2+Z_3} i_D dz$$

$$= \frac{qD_n n_i \exp\left(\frac{-q\psi_B}{kT}\right)}{L}$$

$$\left[ \begin{array}{l} \int_0^{Z_1}(1-e^{-\beta V_D})e^{\beta(V_{GF}-V_T)}dz + \\ \int_{Z_1}^{Z_1+Z_2}(1-e^{-\beta V_D})e^{\beta(V_G-V_T)}dz + \\ \int_{Z_1+Z_2}^{Z_1+Z_2+Z_3}(1-e^{-\beta V_D})e^{\beta(V_{GB}-V_T)}dz \end{array} \right]$$

$$= \frac{qWD_n n_i \exp\left(\frac{-q\psi_B}{kT}\right)}{3L}$$

$$(1 - e^{-\beta v_D}) \left[ \begin{array}{c} (e^{\beta(V_{GF}-V_T)} + e^{\beta(V_{GB}-V_T)}) + \\ \frac{1}{\beta(V_{GB} - V_{GF})}(e^{\beta(V_{GB}-V_T)} - e^{\beta(V_{GF}-V_T)}) \end{array} \right]$$

Figure 7:
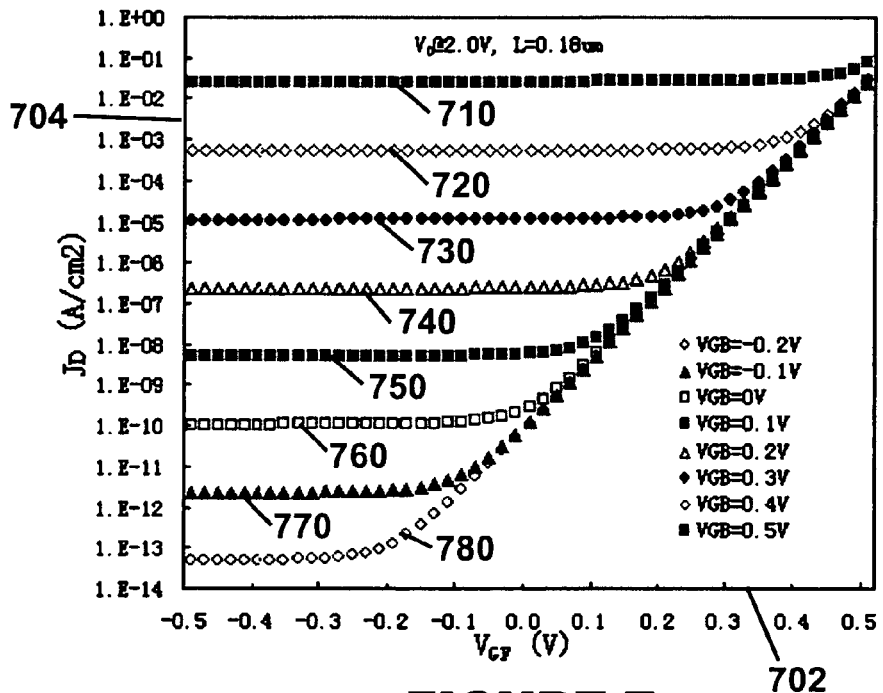
FIG. 7 is a simplified diagram showing drain current density as a function of gate biases under weak inversion for split dual gate field effect transistor according to an embodiment of the present invention.

FIG. 7 is a simplified diagram showing drain current density as a function of gate biases under weak inversion for split dual gate field effect transistor according to an embodiment of the present invention. This diagram is merely an example, which should not unduly limit the scope of the claims. One of ordinary skill in the art would recognize many variations, alternatives, and modifications.

For example, the split dual gate field effect transistor is the device 100. A horizontal axis 702 represents the voltage applied to the gate region 140, and a vertical axis 704 represents the drain current density. The drain region 130 is biased to 2 volts, and the source region 120 and the bottom surface 114 are grounded. Each of the lengths 146 and 156 is equal to about 0.18 µm. For curves 710, 720, 730, 740, 750, 760, and 770, the gate region 150 is biased to 0.5, 0.4, 0.3, 0.2, 0.1, 0, −0.1, and −0.2 volts respectively. As an example, the curves 710, 720, 730, 740, 750, 760, and 770 each are determined based on Equation 12

According to an embodiment of the present invention, sub-threshold conduction in split dual gate field effect transistor is governed by the potential distribution in the entire device. For example, the split dual gate field effect transistor is the device 100.

Figure 8:
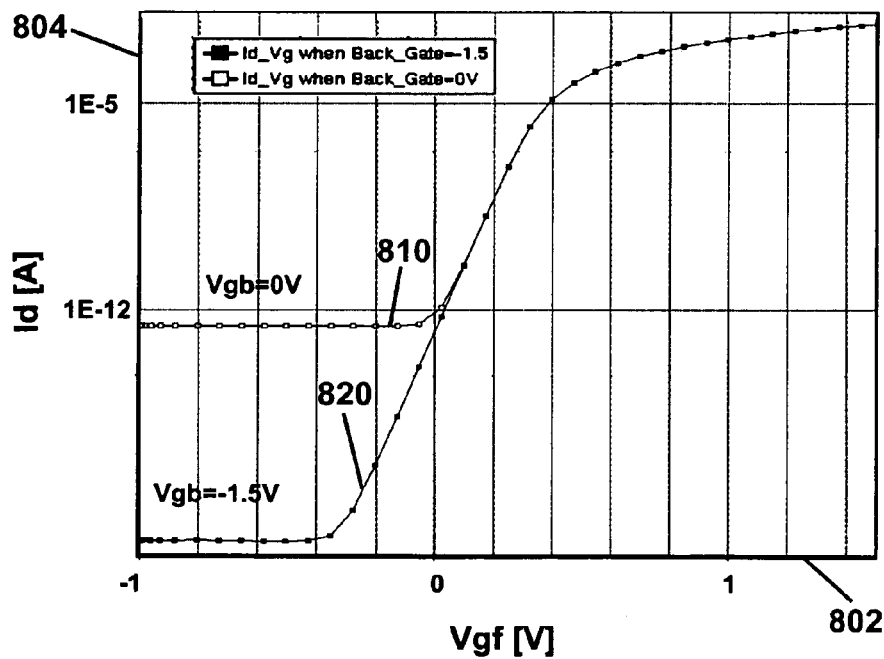
FIG. 8 is a simplified diagram showing drain current as a function of gate biases for split dual gate field effect transistor according to an embodiment of the present invention.

FIG. 8 is a simplified diagram showing drain current as a function of gate biases for split dual gate field effect transistor according to an embodiment of the present invention. This diagram is merely an example, which should not unduly limit the scope of the claims. One of ordinary skill in the art would recognize many variations, alternatives, and modifications.

For example, the split dual gate field effect transistor is the device 100. A horizontal axis 802 represents the voltage applied to the gate region 140, and a vertical axis 804 represents the drain current. The drain region 130 is biased to 1.8 volts, and the source region 120 and the bottom surface 114 are grounded. Each of the lengths 146 and 156 is equal to about 0.18 µm, and the gate oxide region 180 is about 16 Å in thickness. For curves 810 and 820, the gate region 150 is biased to 0 and −1.5 volts respectively. As shown in FIG. 8, the leakage current is equal to about $7.5 \times 10^{-11}$ A/µm if the gate region 150 is biased to 0 volt. Additionally, the leakage current is equal to about $3.4 \times 10^{-11}$ A/µm if the gate region 150 is biased to −1.5 volt. The saturation current is equal to about 1.344 mA/µm. As an example, the curves 810 and 820 each are determined by computer simulation.

Figure 9:
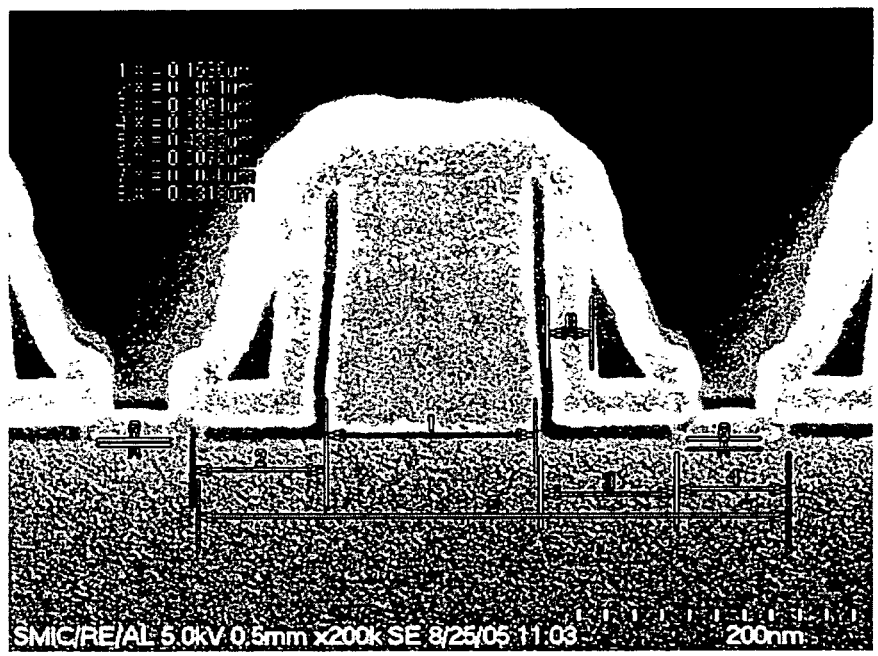
FIG. 9 is a simplified diagram showing a cross-sectional SEM image along the channel length direction for split dual gate field effect transistor according to an embodiment of the present invention.

FIG. 9 is a simplified diagram showing a cross-sectional SEM image along the channel length direction for split dual gate field effect transistor according to an embodiment of the present invention. This diagram is merely an example, which should not unduly limit the scope of the claims. One of ordinary skill in the art would recognize many variations, alternatives, and modifications. The channel length direction points from one of the source region 120 and the drain region 130 to the other of the source region 120 and the drain region 130. For example, the split dual gate field effect transistor is the device 100.

Figure 10:
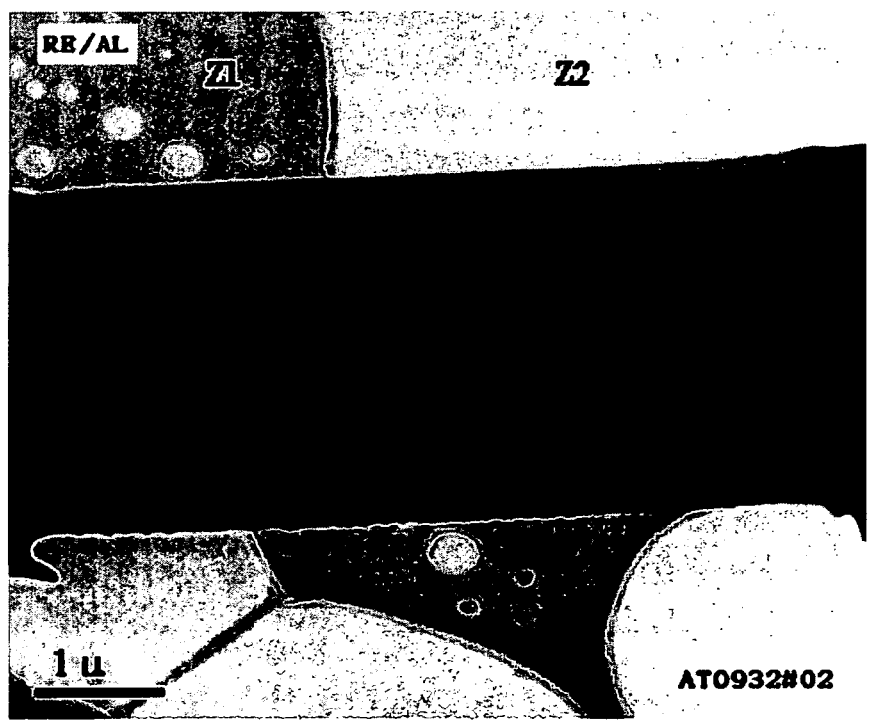
FIG. 10 is a simplified diagram showing a cross-sectional SEM image along the channel width direction for split dual gate field effect transistor according to an embodiment of the present invention.

FIG. 10 is a simplified diagram showing a cross-sectional SEM image along the channel width direction for split dual gate field effect transistor according to an embodiment of the present invention. This diagram is merely an example, which should not unduly limit the scope of the claims. One of ordinary skill in the art would recognize many variations, alternatives, and modifications. For example, the split dual gate field effect transistor is the device 100.

Figure 11:
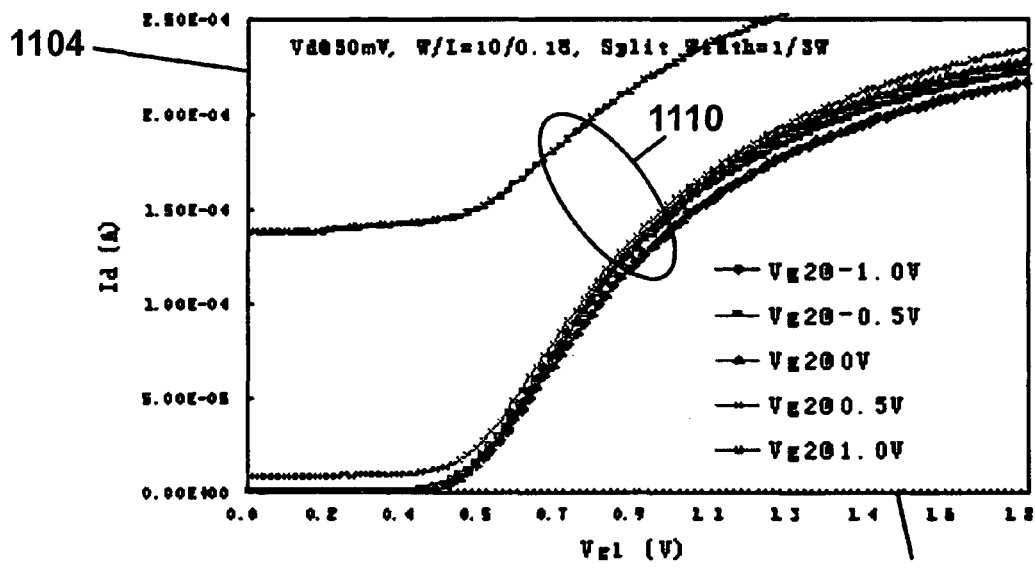
FIG. 11 is a simplified diagram showing measured drain current as a function of gate biases at low drain voltage for split dual gate field effect transistor according to an embodiment of the present invention.

FIG. 11 is a simplified diagram showing measured drain current as a function of gate biases at low drain voltage for split dual gate field effect transistor according to an embodiment of the present invention. This diagram is merely an example, which should not unduly limit the scope of the claims. One of ordinary skill in the art would recognize many variations, alternatives, and modifications.

For example, the split dual gate field effect transistor is the device 100. A horizontal axis 1102 represents the voltage applied to the gate region 140, and a vertical axis 1104 represents the drain current. The drain region 130 is biased to 50 mV, and the source region 120 and the bottom surface 114 are grounded. The total width of the width 148, the width 158, and the width 168 is equal to about 10 µm, and each of the lengths 146 and 156 is equal to about 0.18 µm. Z1, Z2, and Z3 are substantially equal. For the curves 1110, the gate region 150 is biased to 1.0, 0.5, 0, −0.5, and −1.0 volt respectively.

Figure 12:
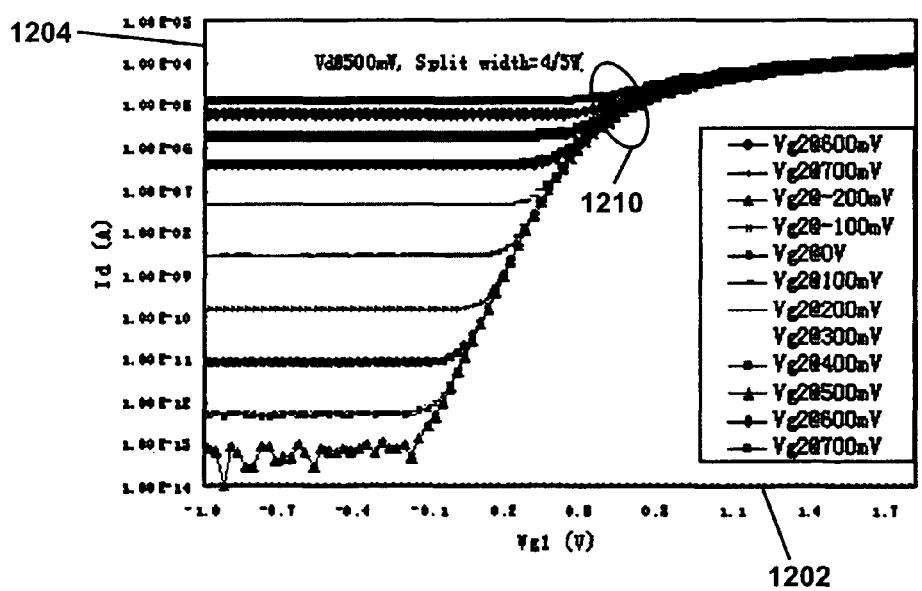
FIG. 12 is a simplified diagram showing measured drain current as a function of gate biases at low drain voltage for split dual gate field effect transistor according to another embodiment of the present invention.

FIG. 12 is a simplified diagram showing measured drain current as a function of gate biases at low drain voltage for split dual gate field effect transistor according to another embodiment of the present invention. This diagram is merely an example, which should not unduly limit the scope of the claims. One of ordinary skill in the art would recognize many variations, alternatives, and modifications.

For example, the split dual gate field effect transistor is the device 100. A horizontal axis 1202 represents the voltage applied to the gate region 140, and a vertical axis 1204 represents the drain current. The drain region 130 is biased to 500 mV, and the source region 120 and the bottom surface 114 are grounded. The total width of the width 148, the width 158, and the width 168 is equal to about 10 µm, and each of the lengths 146 and 156 is equal to about 0.18 µm. Z1, Z2, and Z3 are substantially equal. For the curves 1210, the gate region 150 is biased to various voltages respectively.

Figure 13:
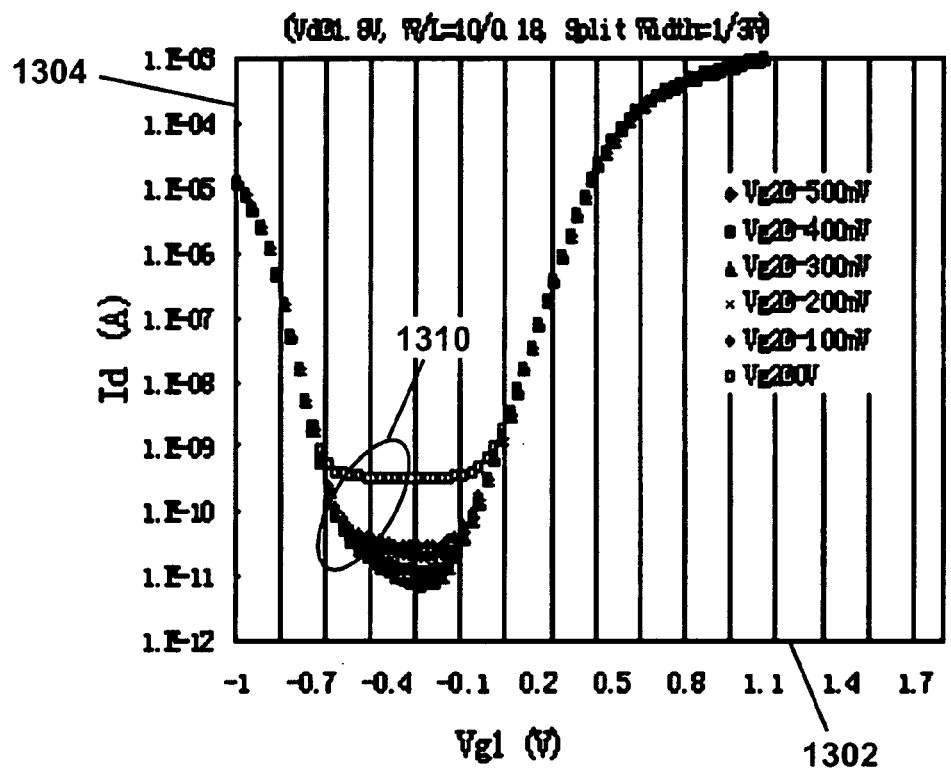
FIG. 13 is a simplified diagram showing measured drain current as a function of gate biases at high drain voltage for split dual gate field effect transistor according to yet another embodiment of the present invention.

FIG. 13 is a simplified diagram showing measured drain current as a function of gate biases at high drain voltage for split dual gate field effect transistor according to yet another embodiment of the present invention. This diagram is merely an example, which should not unduly limit the scope of the claims. One of ordinary skill in the art would recognize many variations, alternatives, and modifications.

For example, the split dual gate field effect transistor is the device 100. A horizontal axis 1302 represents the voltage applied to the gate region 140, and a vertical axis 1304 represents the drain current. The drain region 130 is biased to 1.8 volts, and the source region 120 and the bottom surface 114 are grounded. The total width of the width 148, the width 158, and the width 168 is equal to about 10 µm, and each of the lengths 146 and 156 is equal to about 0.18 µm. Z1, Z2, and Z3 are substantially equal. For the curves 1310, the gate region 150 is biased to 0, −0.1, −0.2, −0.3, −0.4, and −0.5 volts respectively. As shown in FIG. 13, $I_{off}$ is equal to $2.97 \times 10^{-10}$ Å if the gate region 150 is biased at −0.4 volts. $I_{off}$ is equal to $6.11 \times 10^{-10}$ Å if the gate region 150 is biased to 0 volt. The $I_{off}$ can be reduced by as much as 50% with proper biasing of the gate region 150.

Figure 14:
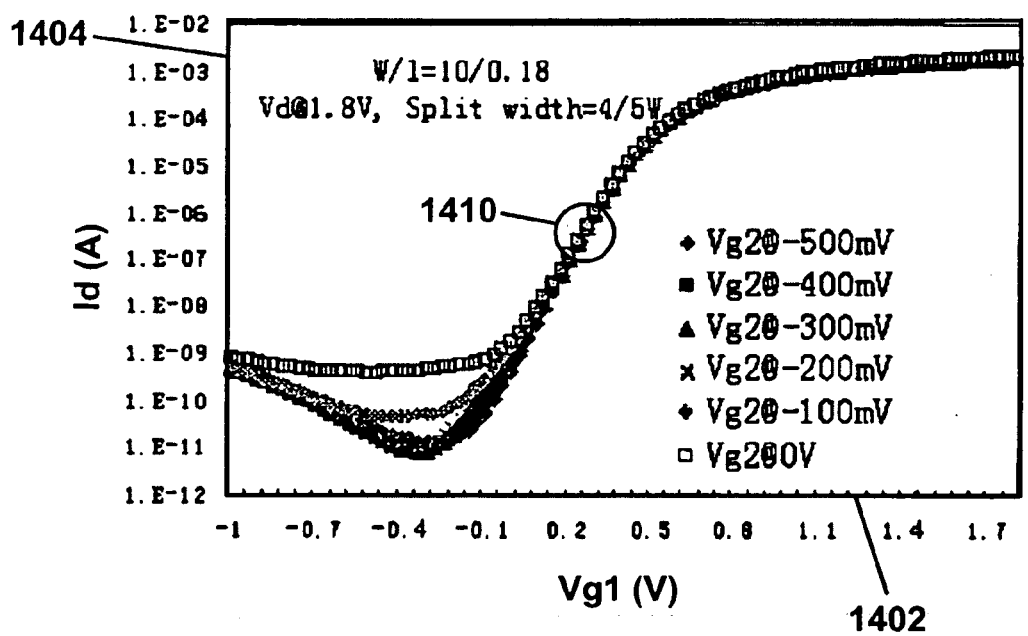
FIG. 14 is a simplified diagram showing measured drain current as a function of gate biases at high drain voltage for split dual gate field effect transistor according to yet another embodiment of the present invention.

FIG. 14 is a simplified diagram showing measured drain current as a function of gate biases at high drain voltage for split dual gate field effect transistor according to yet another embodiment of the present invention. This diagram is merely an example, which should not unduly limit the scope of the claims. One of ordinary skill in the art would recognize many variations, alternatives, and modifications.

For example, the split dual gate field effect transistor is the device 100. A horizontal axis 1402 represents the voltage applied to the gate region 140, and a vertical axis 1404 represents the drain current. The drain region 130 is biased to 1.8 volts, and the source region 120 and the bottom surface 114 are grounded. The total width of the width 148, the width 158, and the width 168 is equal to about 10 μm, and each of the lengths 146 and 156 is equal to about 0.18 μm. Z1 and Z3 are substantially equal, and Z2 is equal to about 8×Z1. For the curves 1410, the gate region 150 is biased to 0, −0.1, −0.2, −0.3, −0.4, and −0.5 volts respectively. As shown in FIG. 14, $I_{off}$ is equal to $4.28 \times 10^{-11}$ A if the gate region 150 is biased at −0.5 volts. $I_{off}$ is equal to $1.77 \times 10^{-10}$ A if the gate region 150 is biased to 0 volt. The $I_{off}$ can be reduced by as much as 75% with proper biasing of the gate region 150.

Figure 15:
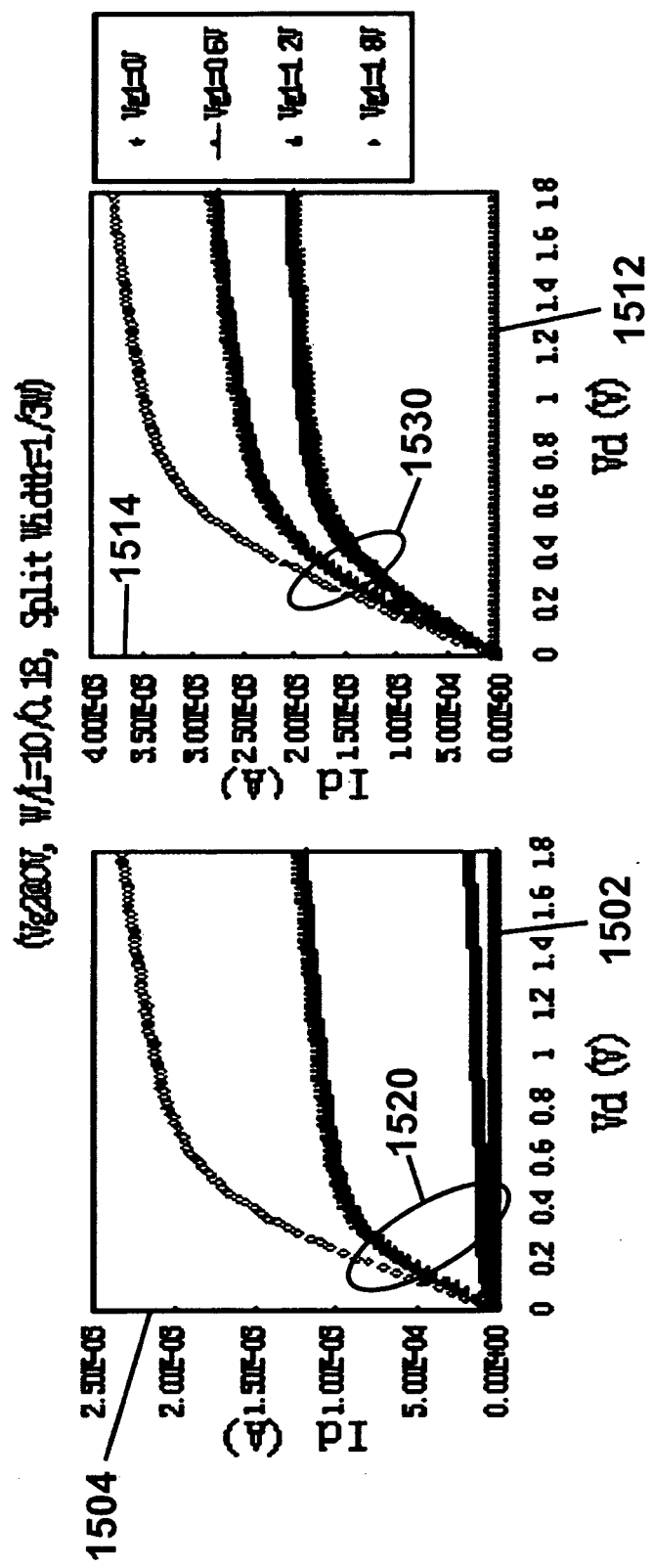
FIG. 15 is a simplified diagram showing measured drain current as a function of drain bias for split dual gate field effect transistor according to an embodiment of the present invention.

FIG. 15 is a simplified diagram showing measured drain current as a function of drain bias for split dual gate field effect transistor according to an embodiment of the present invention. This diagram is merely an example, which should not unduly limit the scope of the claims. One of ordinary skill in the art would recognize many variations, alternatives, and modifications.

For example, the split dual gate field effect transistor is the device 100. Horizontal axes 1502 and 1512 each represent the voltage applied to the drain region 130, and vertical axes 1504 and 1514 each represent the drain current. The source region 120 and the bottom surface 114 are grounded. The total width of the width 148, the width 158, and the width 168 is equal to about 10 μm, and each of the lengths 146 and 156 is equal to about 0.18 μm. For curves 1520, the gate region 150 is biased to 0 volts, and for curves 1530, the gate region 150 is biased to 1.8 volts. The curves 1520 correspond to 1.8, 1.2, 0.6, and 0 volt respectively, which are applied to the gate region 140. Additionally, the curves 1530 correspond to 1.8, 1.2, 0.6, and 0 volt respectively, which are applied to the gate region 140.

Figure 16:
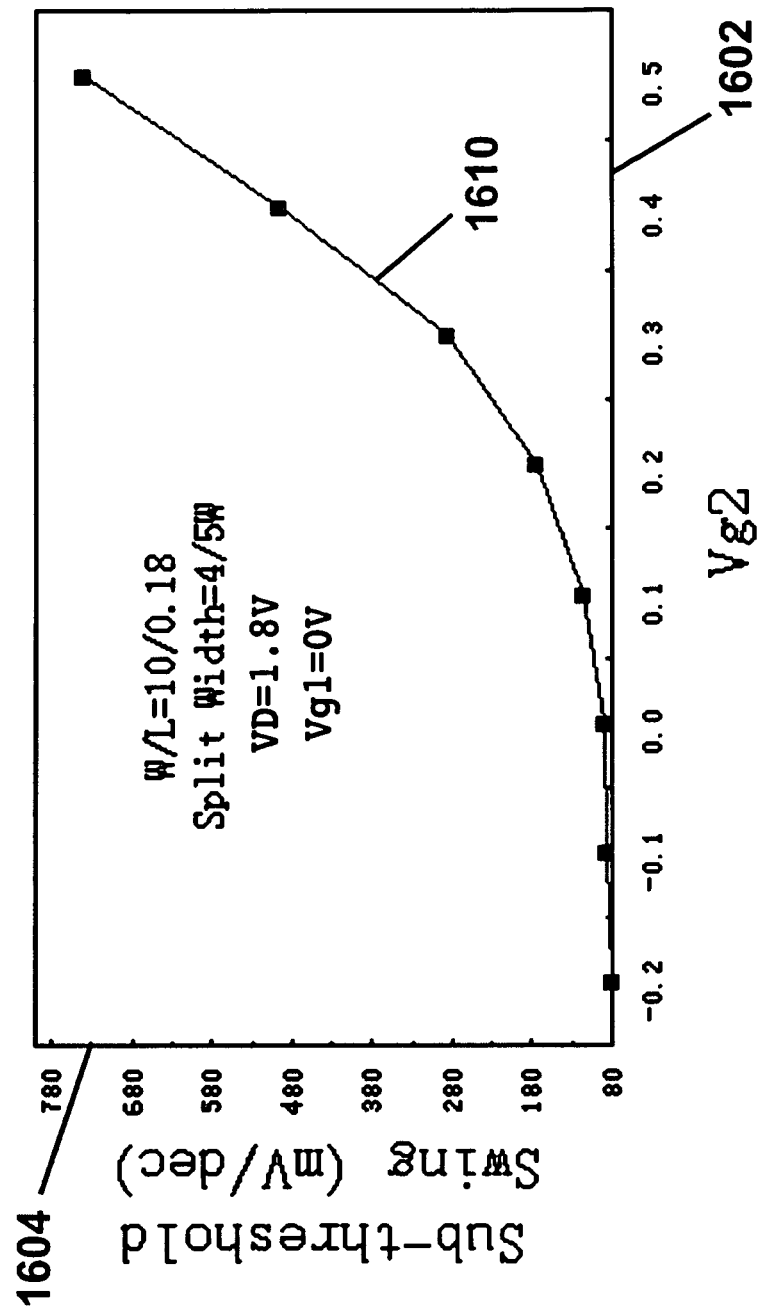
FIG. 16 is a simplified diagram showing measured sub-threshold swing as a function of gate bias for split dual gate field effect transistor according to an embodiment of the present invention.

FIG. 16 is a simplified diagram showing measured sub-threshold swing as a function of gate bias for split dual gate field effect transistor according to an embodiment of the present invention. This diagram is merely an example, which should not unduly limit the scope of the claims. One of ordinary skill in the art would recognize many variations, alternatives, and modifications.

For example, the split dual gate field effect transistor is the device 100. In another example, the split dual gate field effect transistor is an n-channel transistor. A horizontal axis 1602 represents the voltage applied to the gate region 140, and a vertical axis 1604 represents the sub-threshold swing. The drain region 130 is biased to 1.8 volts, and the source region 120 and the bottom surface 114 are grounded. The total width of the width 148, the width 158, and the width 168 is equal to about 10 μm, and each of the lengths 146 and 156 is equal to about 0.18 μm. Z1 and Z3 are substantially equal, and Z2 is equal to about 8×Z1. For curve 1610, the gate region 150 is biased to 0 volt. The two independent gate biases for the gate regions 140 and 150 can modulate the threshold voltage, and provide dynamical control on device characteristics. For example, the device characteristics include the threshold voltage and the sub-threshold swing.

According to another embodiment, a semiconductor device with at least two gate regions includes a substrate region including a surface, a source region in the substrate region, and a drain region in the substrate region. The drain region and the source region are separate from each other. Additionally, the device includes a first gate region on the surface, a second gate region on the surface, and an insulation region on the surface and between the first gate region and the second gate region. The first gate region and the second gate region are separated by the insulation region. The first gate region is capable of forming a first channel in the substrate region. The first channel is from the source region to the drain region. The second gate region is capable of forming a second channel in the substrate region. The second channel is from the source region to the drain region. For example, the device is implemented according to the device 100.

According to yet another embodiment, a semiconductor transistor with at least two gate regions includes a substrate region including a surface, a source region in the substrate region, and a drain region in the substrate region. The drain region and the source region are separate from each other. Additionally, the transistor includes a first gate region on the surface, a second gate region on the surface, and an insulation region on the surface and between the first gate region and the second gate region. Moreover, the transistor includes a first spacer region. The first spacer region is in contact with the first gate region, the second gate region, and the insulation region. Also, the transistor includes a second spacer region. The second spacer region is in contact with the first gate region, the second gate region, and the insulation region. The first gate region and the second gate region are separated by the insulation region. The first gate region is capable of forming a first channel from the source region to the drain region in the substrate region, and the second gate region is capable of forming a second channel from the source region to the drain region in the substrate region. The first channel and the second channel are not in contact to each other. For example, the transistor is implemented according to the device 100.

According to yet another embodiment, a transistor with at least two gate regions includes a substrate region including a surface, a source region in the substrate region, and a drain region in the substrate region. The drain region and the source region are separate from each other. Additionally, the transistor includes a first gate region on the surface, a second gate region on the surface, and an insulation region on the surface and between the first gate region and the second gate region. Moreover, the transistor includes a first spacer region. The first spacer region is in contact with the first gate region, the second gate region, and the insulation region. Also, the transistor includes a second spacer region. The second spacer region is in contact with the first gate region, the second gate region, and the insulation region. The first gate region and the second gate region are separated by the insulation region. The first gate region is capable of forming a first channel from the source region to the drain region in the substrate region, and the second gate region is capable of forming a second channel from the source region to the drain region in the substrate region. The first channel and the second channel are not in contact to each other. The first channel is associated with a first channel length, the first channel length being equal to or shorter than 200 nm. The insulation region is associated with a width in a direction from the first gate region to the second gate region, and the width ranges from 10 nm to 10,000 nm. For example, the device is implemented according to the device 100.

Figure 17:
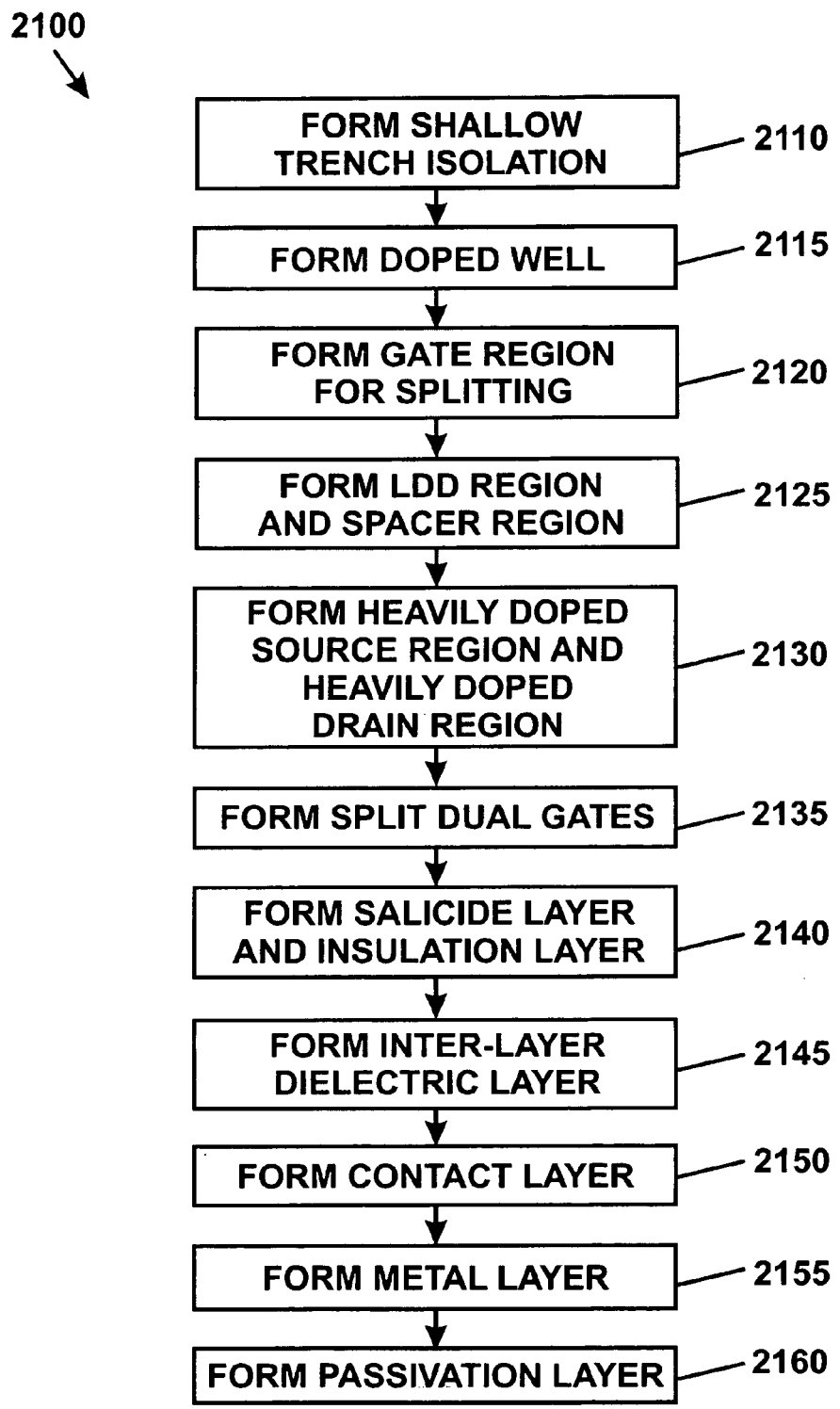
FIG. 17 is a simplified method for making split dual gate field effect transistor according to an embodiment of the present invention.

FIG. 17 is a simplified method for making split dual gate field effect transistor according to an embodiment of the present invention. This diagram is merely an example, which should not unduly limit the scope of the claims herein. The method 2100 includes the following processes:

1. Process 2110 for forming shallow trench isolation;
2. Process 2115 for forming doped well;
3. Process 2120 for forming gate region for splitting;
4. Process 2125 for forming LDD region and spacer region;

5. Process 2130 for forming heavily doped source region and heavily doped drain region;
6. Process 2135 for forming split dual gates;
7. Process 2140 for forming salicide layer and insulation layer;
8. Process 2145 for forming inter-layer dielectric layer;
9. Process 2150 for forming contact layer;
10. Process 2155 for forming metal layer;
11. Process 2160 for forming passivation layer.

The above sequence of processes provides a method according to an embodiment of the present invention. Other alternatives can also be provided where processes are added, one or more processes are removed, or one or more processes are provided in a different sequence without departing from the scope of the claims herein. For example, the split dual gate field effect transistor made by the method 2100 is the device 100. Future details of the present invention can be found throughout the present specification and more particularly below.

Figure 18A:
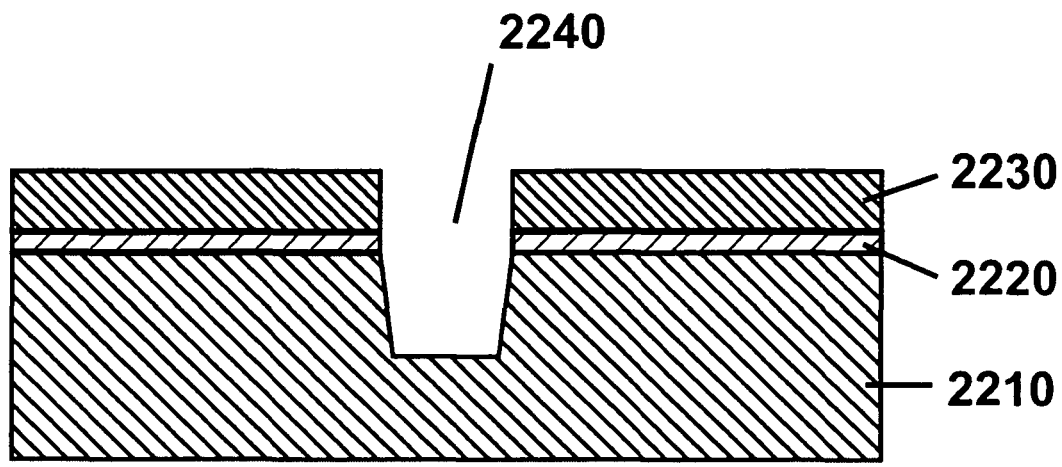
FIGS. 18(A) and (B) show a simplified method for forming shall trench isolation for making split dual gate field effect transistor according to an embodiment of the present invention.
Figure 18B:
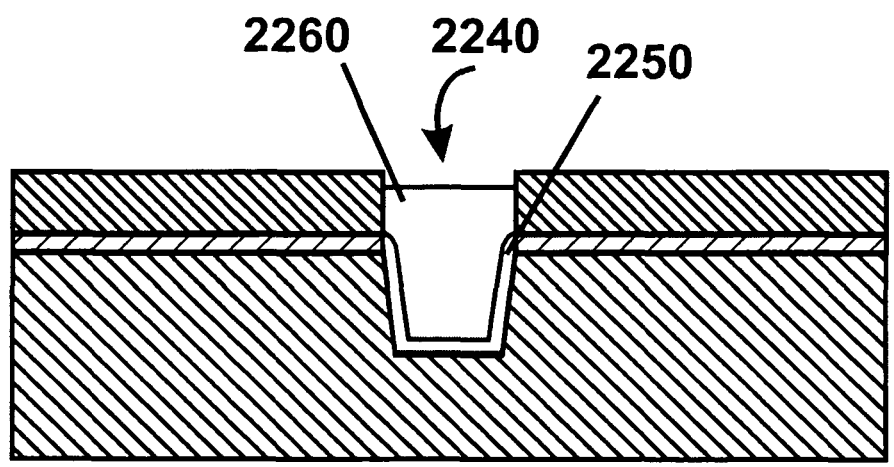

At the process 2110, one or more shallow trench isolations are formed. FIGS. 18(A) and (B) show a simplified method for forming shallow trench isolation for making split dual gate field effect transistor according to an embodiment of the present invention. These diagrams are merely examples, which should not unduly limit the scope of the claims. One of ordinary skill in the art would recognize many variations, alternatives, and modifications.

As shown in FIGS. 18(A) and (B), a starting semiconductor wafer 2210 is provided. For example, the starting wafer 2210 includes silicon. In another example, the starting wafer 2210 includes a substrate region. On the starting wafer 2210, a silicon oxide layer 2220, a silicon nitride layer 2230, and a silicon oxynitride layer are formed sequentially. Additionally, a trench 2240 is formed by etching part of the silicon oxynitride layer, the silicon nitride layer 2230, the silicon oxide layer 2220, and the starting wafer 2210. The bottom surface and side surfaces of the trench 2240 are covered by an oxide layer 2250. Afterwards, the trench is filled by an oxide material 2260. For example, the oxide material 2260 includes high density plasma (HDP) CVD oxide.

In one embodiment, the following processes are performed:
Wafer Start (P-type, 8-12 ohm-cm)
AA OXIDE DEPOSITION (Pad oxide 110 Å/920° C., 45 minutes dry $O_2$)
AA Nitride DEPOSITION 1625 Å (780° C., 10-40 Pa, $SiH_2Cl_2/NH_3$)
SiON DARC DEPOSITION 320 Å (DARC, 320 Å, helium based)
AA PHOTO/DUV (0.23±0.023 μm) AA ETCH (0.22±0.025 μm)
  (SiN/OXIDE etch chamber-1, Si etch chamber-2, 3500 Å, 80 degrees)
STI Liner OXIDE 200 Å (1000° C., dry $O_2$)
STI HDP (HDP STI5800, 5.8 KÅ)
STI CMP (4100±500 Å, Polish 2.5 KÅ/DIW-HF clean)

Figure 19:
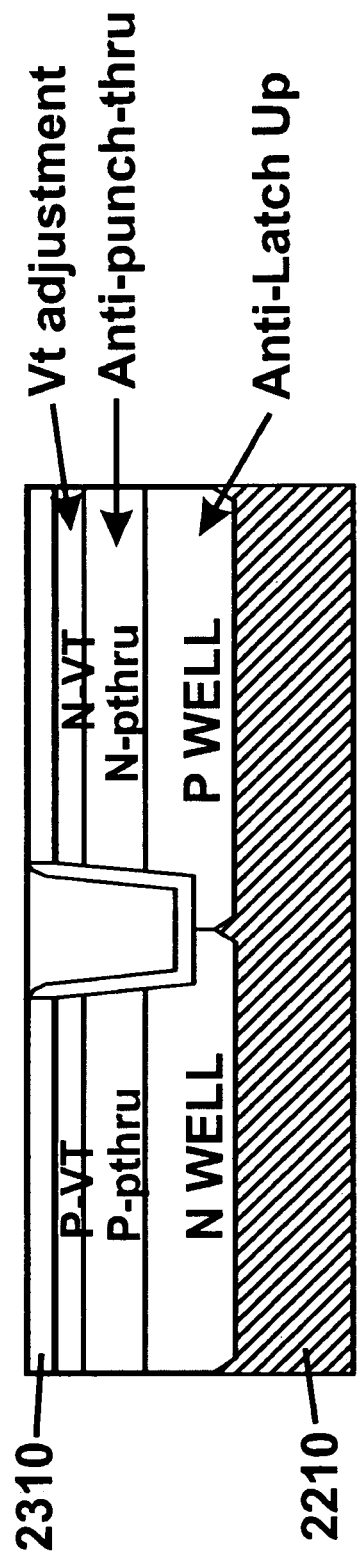
FIG. 19 shows a simplified method for forming doped well for making split dual gate field effect transistor according to an embodiment of the present invention.

At the process 2115, one or more doped wells are formed. FIG. 19 shows a simplified method for forming doped well for making split dual gate field effect transistor according to an embodiment of the present invention. This diagram is merely an example, which should not unduly limit the scope of the claims. One of ordinary skill in the art would recognize many variations, alternatives, and modifications.

As shown in FIG. 19, the silicon oxynitride layer, the silicon nitride layer 2230, and the silicon oxide layer 2220 are removed from the wafer 2210. On the wafer 2210, another oxide layer 2310 is formed. Afterwards, in one example, an n-well is formed in the wafer 2210. Additionally, an anti-punch-through ion implantation is performed with p-type dopants, and a threshold-adjustment ion implantation is performed also with p-type dopants. In another example, a p-well is formed in the wafer 2210. Additionally, an anti-punch-through ion implantation is performed with n-type dopants, and a threshold-adjustment ion implantation is performed also with n-type dopants.

In one embodiment, the following processes are performed:
AA Nitride Removal (50:1 HF 60 seconds and 175° C. $H_3PO_4$ 60 minutes)
Measure remain oxide thickness<120 Å/Pad oxide Removal (50:1 HF 2.5 minutes, E/R=55 Å/minute)
SACRIFICE OXIDE DEPOSITION (Dry 110 Å, 920° C., 45 minutes, $O_2$)

For example, the following additional processes are performed for NMOS transistor:
P-Well Photo (PW/AA overlay±0.1 μm)
P-Well Implant: P-well B11 (specie $B^+$, energy 160 KeV, dosage $1.5 \times 10^{13}$ ions/cm$^2$, tilt 0)
N-APT Implant: N-APT B11 (specie $B^+$, energy 25 KeV, dosage $5.5 \times 10^{12}$ ions/cm$^2$, tilt 0)
VTN Implant: VT IMP In115 (specie $In^+$, energy 170 KeV, dosage $7.0 \times 10^{12}$ ions/cm$^2$, tilt 0)

In another example, the following additional processes are performed for PMOS transistor:
N-Well Photo (NW/OD overlay±0.1 μm)
N-well Implant: N-well P31 (specie $P^+$, energy 440 KeV, dosage $1.5 \times 10^{13}$ ions/cm$^2$, tilt 0)
P-APT Implant: P-APT P31 (specie $P^+$, energy 140 KeV, dosage $1.5 \times 10^{12}$ ions/cm$^2$, tilt 0)
VTP Implant: VTP A75 (specie $As^+$, energy 130 KeV, dosage $1.1 \times 10^{13}$ ions/cm$^2$, tilt 0)

Figure 20A:
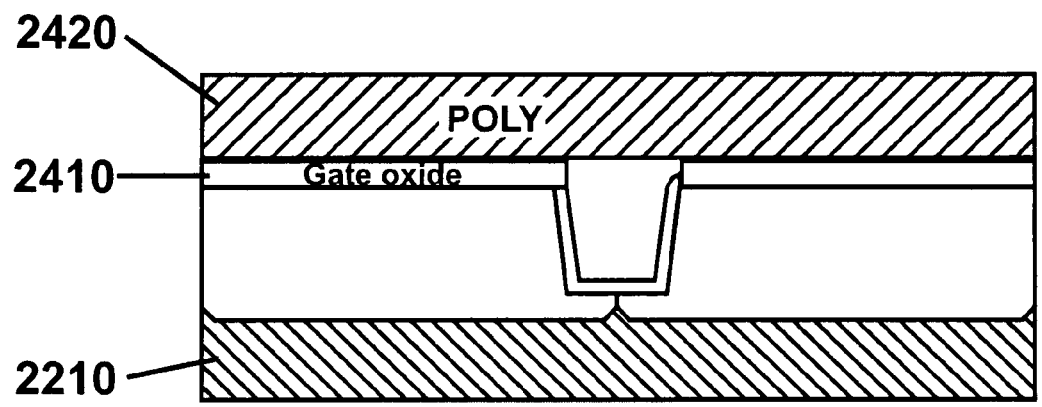
FIGS. 20(A) and (B) show a simplified method for forming gate region for splitting for making split dual gate field effect transistor according to an embodiment of the present invention.
Figure 20B:
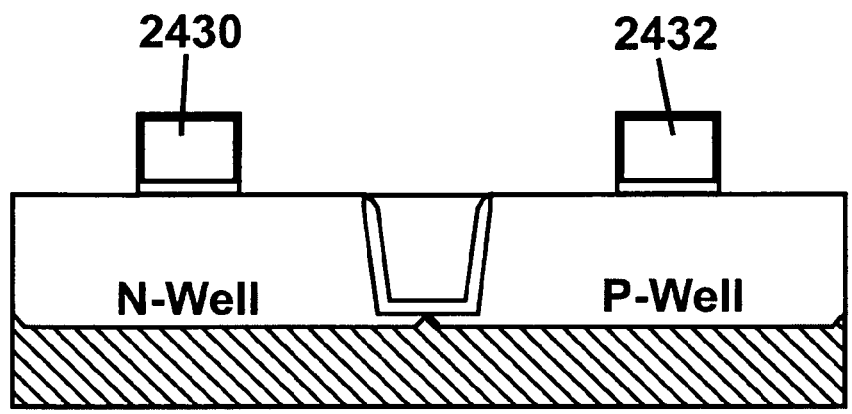

At the process 2120, one or more gate regions are formed for splitting. FIGS. 20(A) and (B) show a simplified method for forming gate region for splitting for making split dual gate field effect transistor according to an embodiment of the present invention. These diagrams are merely examples, which should not unduly limit the scope of the claims. One of ordinary skill in the art would recognize many variations, alternatives, and modifications.

As shown in FIGS. 20(A) and (B), the oxide layer 2310 is removed, and another oxide layer 2410 is deposited on the wafer 2210. On the oxide layer 2410, a polysilicon layer 2420 is formed. Afterwards, the polysilicon layer 2420 is partially etched to form polysilicon gate regions 2430 and 2432. The polysilicon gate regions 2430 and 2432 are then partially oxidized under certain conditions.

In one embodiment, the following processes are performed:
SAC Oxide Removal
Gate Oxide Deposition (750° C., Wet $O_2$; 900° C. anneal; 32±2 Å)
POLY Deposition (620° C. 2000 Å, Undoped poly/crystallized flat poly)
DARC DEPOSITION (DARC, 320 Å, He based)
POLY PHOTO (DUV scanner, 0.18±0.015 μm; Overlay (Poly Gate/AA=±0.07 μm))
Poly Gate Etch: 1. Hard bake; 2. Poly etch; 3. polymer dip (100:1 HF 10 seconds); 4. PR strip; 5. AEI/CD (0.18±0.015 μm); 6. Oxide thickness measure (Trench OXIDE 3550±600 Å, Oxide on Active Area>10 Å); 7. SiON mask remove (50:1 HF 5 seconds, and $H_3PO_4$ 7 minutes)
Poly Re_Oxidation (1000° C., RTO 20±4 Å for etch damage recovery).

Figure 21:
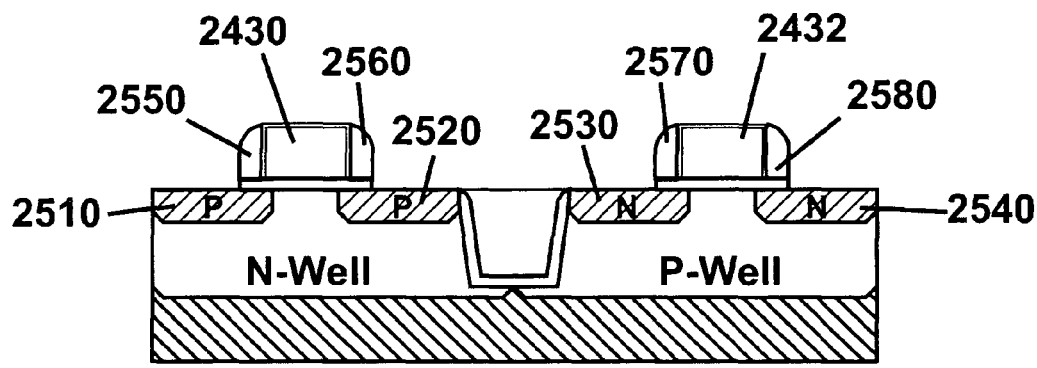
FIG. 21 shows a simplified method for forming LDD region and spacer region for making split dual gate field effect transistor according to an embodiment of the present invention.

At the process 2125, one or more LDD regions and one or more spacer regions are formed. FIG. 21 shows a simplified method for forming LDD region and spacer region for making split dual gate field effect transistor according to an embodiment of the present invention. This diagram is merely an example, which should not unduly limit the scope of the claims. One of ordinary skill in the art would recognize many variations, alternatives, and modifications.

As shown in FIG. 21, one or more ion implantation processes are performed to form one or more LDD regions. For example, the LDD regions 2510 and 2520 are p-type doped for PMOS. In another example, the LDD regions 2530 and 2540 are n-type doped for NMOS. Additionally, one or more spacers are formed. For example, each of the spacers 2550, 2560, 2570, and 2580 includes a nitride layer sandwiched between two oxide layers.

In one embodiment, the following processes are performed:
NLL PHOTO (e.g., 1.8V device) (In-line monitor OVERLAY/CD)
PLL PHOTO (e.g., 1.8V device) (In-line monitor OVERLAY/CD)
ONO Spacer DEPOSITION (In-line monitor ONO THICKNESS)
Spacer ETCH (In-line monitor remaining OXIDE THICKNESS and STI OXIDE THICKNESS)

Figure 22:
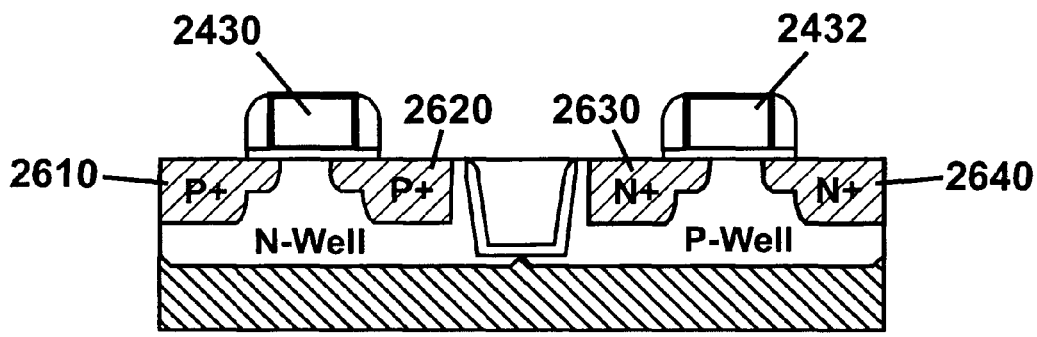
FIG. 22 shows a simplified method for forming heavily doped source region and heavily doped drain region for making split dual gate field effect transistor according to an embodiment of the present invention.

At the process 2130, one or more heavily doped source regions and one or more heavily doped drain regions are formed. FIG. 22 shows a simplified method for forming heavily doped source region and heavily doped drain region for making split dual gate field effect transistor according to an embodiment of the present invention. This diagram is merely an example, which should not unduly limit the scope of the claims. One of ordinary skill in the art would recognize many variations, alternatives, and modifications.

As shown in FIG. 22, one or more ion implantation processes are performed to form one or more heavily doped source regions and heavily doped drain regions. For example, the formed regions 2610 and 2620 are doped to p+ for PMOS. In another example, the formed regions 2630 and 2640 are doped to n+ for NMOS.

In one embodiment, the following processes are performed:
N+S/D Photo Mask
  Overlay (N+/AA=±0.12 μm)
  N+S/D Implant: 1. specie $As^+$, energy 60 KeV, dosage $5.5 \times 10^{15}$ ions/cm$^2$, tilt 0; 2. specie $P^+$, energy 35 KeV, dosage $1.5 \times 10^{14}$ ions/cm$^2$, tilt 0
N+S/D RTA anneal (1025° C., 20 seconds, $N_2$)
P+S/D Photo Mask
  Overlay (P+/AA=±0.12 μm)
  P+S/D Implant: 1. specie $B^+$, energy 5 KeV, dosage $3.5 \times 10^{13}$ ions/cm$^2$, tilt 0; 2. specie $B^+$, energy 15 KeV, dosage $3.0 \times 10^{13}$ ions/cm$^2$, tilt 0

Figure 23:
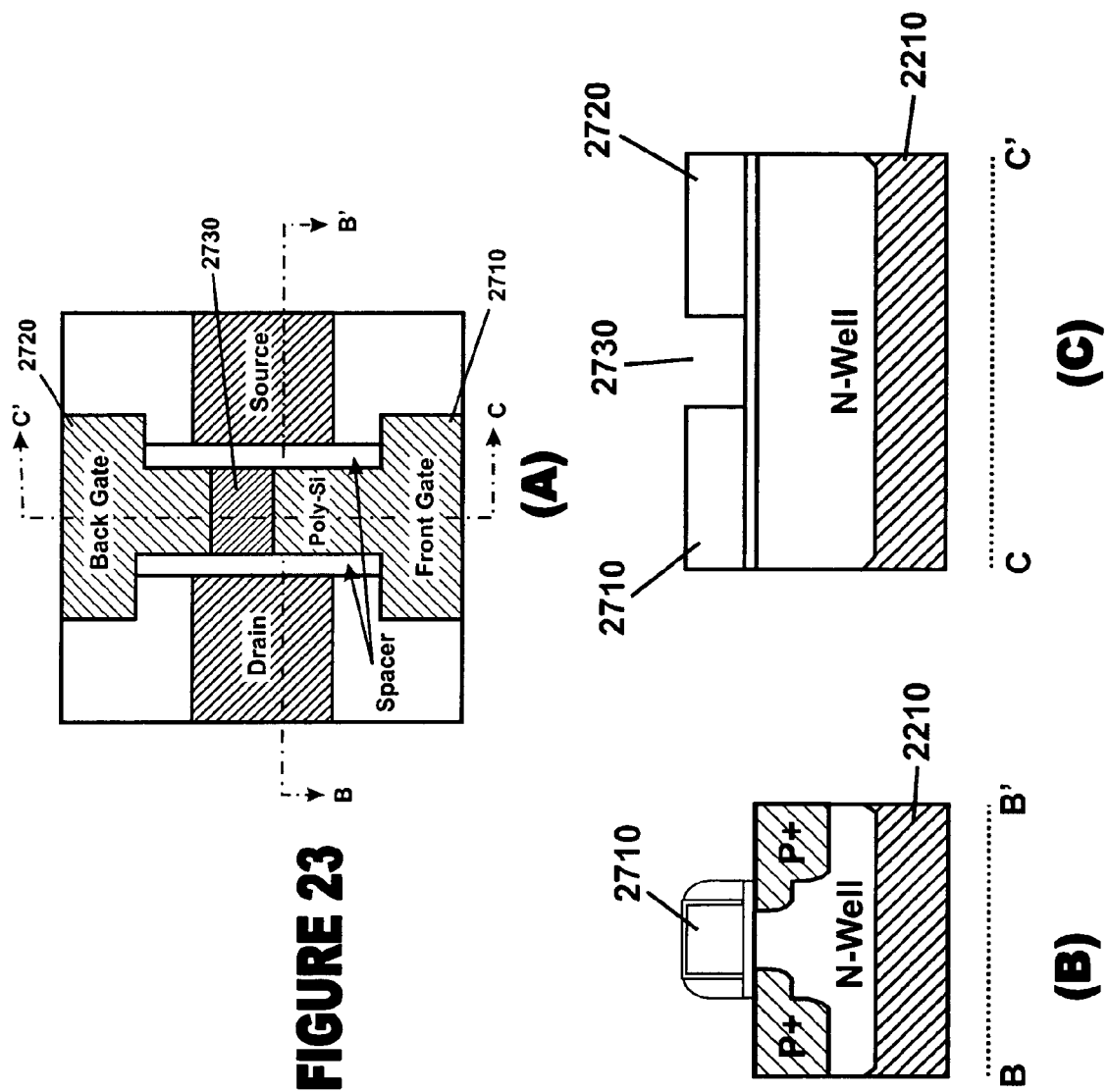
FIGS. 23(A), (B), and (C) show a simplified method for forming split dual gates for making split dual gate field effect transistor according to an embodiment of the present invention.

At the process 2135, split dual gates are formed. FIGS. 23(A), (B), and (C) show a simplified method for forming split dual gates for making split dual gate field effect transistor according to an embodiment of the present invention. FIG. 23(B) is a simplified cross-section along B and B', and FIG. 23(C) is a simplified cross-section along C and C'. These diagrams are merely examples, which should not unduly limit the scope of the claims. One of ordinary skill in the art would recognize many variations, alternatives, and modifications.

As shown in FIGS. 23(A), (B), and (C), part of the polysilicon gate region 2430 is removed. As a result, dual gate regions 2710 and 2720 are formed. Additionally, the dual gate regions 2710 and 2720 are separated by a gap 2730, such an air gap. In another example, similar dual gate regions are formed by removing part of the polysilicon gate region 2432.

In one embodiment, the following processes are performed for poly-silicon split dual gate (PSDG):
PSDG POLY PHOTO (DUV scanner, Overlay (PSDG/AA=±0.07 μm))
PSDG Poly Gate Etch: 1. Hard bake; 2. Poly etch; 3. polymer dip (100:1 HF 10 seconds); 4. PR strip; 5. AEI.

In another embodiment, the following processes are performed to form the dual gate regions 2710 and 2720:
Polysilicon photolithography. For example: DUV scanner, 0.3±0.015 μm; Overlay (Poly Gate/AA=±0.07 μm).
Polysilicon etching. For example: 1. Hard bake; 2. Poly etch; 3. polymer dip (100:1 HF 10 seconds); 4. PR strip; 5. AEI/CD (0.3±0.015 μm); 6. Measure Oxide thickness on Active Area (>10 Å)

Figure 24:
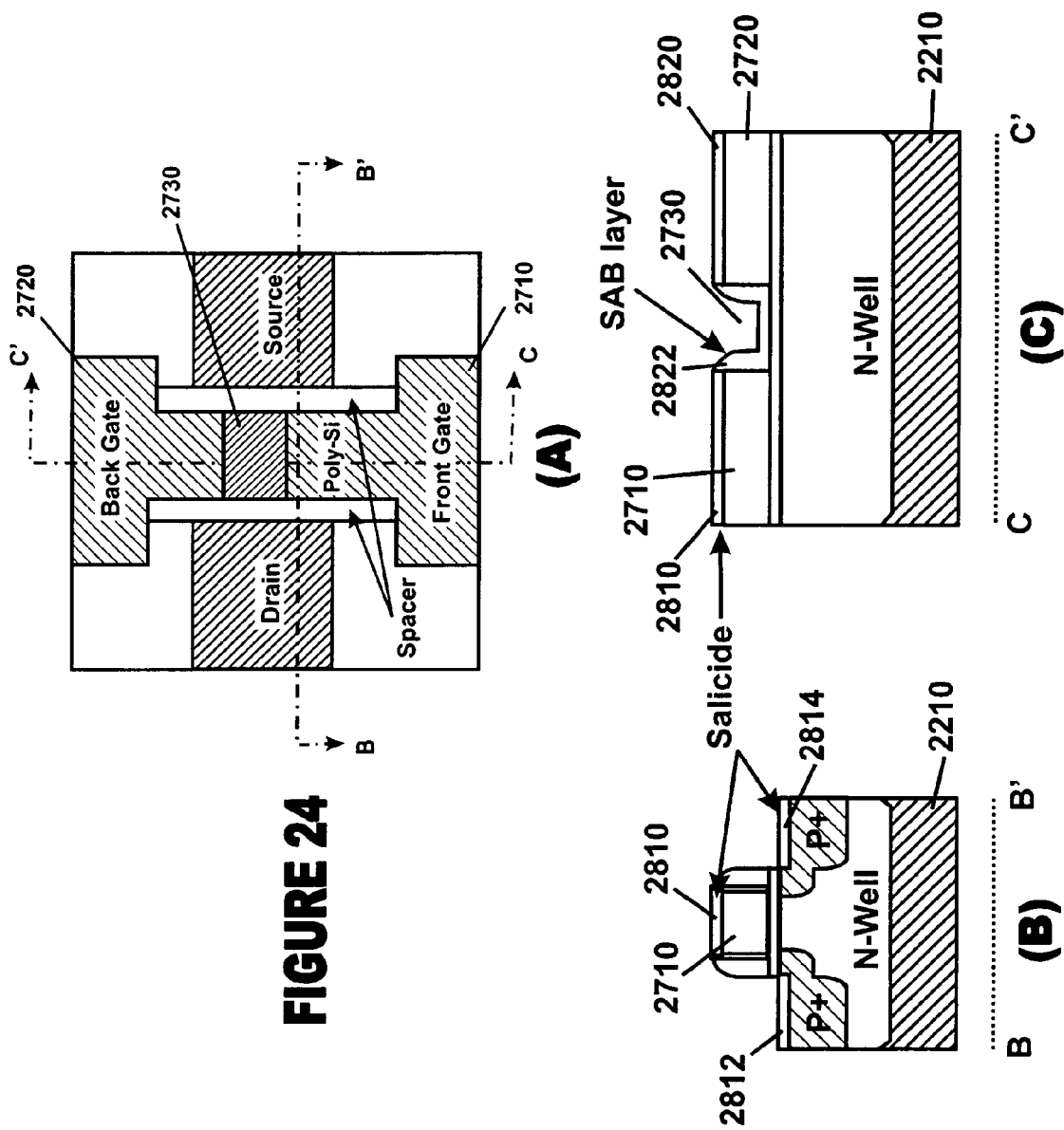
FIGS. 24(A), (B), and (C) show a simplified method for forming salicide layer and insulation layer for making split dual gate field effect transistor according to an embodiment of the present invention.

At the process 2140, one or more salicide layers are formed. FIGS. 24(A), (B), and (C) show a simplified method for forming salicide layer and insulation layer for making split dual gate field effect transistor according to an embodiment of the present invention. FIG. 24(B) is a simplified cross-section along B and B', and FIG. 24(C) is a simplified cross-section along C and C'. These diagrams are merely examples, which should not unduly limit the scope of the claims. One of ordinary skill in the art would recognize many variations, alternatives, and modifications.

As shown in FIGS. 24(A), (B), and (C), salicide layers 2810 and 2820 are formed on the dual gate regions 2710 and 2720. Additionally, at least salicide layers 2812 and 2814 are formed on the wafer 2210. Additionally, within the gap 2730, an insulation layer 2822 is formed. For example, the insulation layer 2822 includes a salicide block layer (SAB), such as an silicon-rich oxide layer. In another example, the insulation layer 2822 includes an insulation material, such as silicon oxide, silicon nitride, and/or silicon oxynitride. In yet another example, the insulation layer 2822 and the remaining part of the gap 2730 form an insulation region that separates the dual gate regions 2710 and 2720. In yet another example, similar salicide layers and insulation layer are formed for dual gate regions made from the polysilicon gate region 2432.

In one embodiment, the following processes are performed:
Salicide Block OXIDE DEPOSITION (SiON 350 Å)
S/D RTA Anneal (1015° C., 10 seconds, $N_2$)
SAB PHOTO (OVERLAY to AA, SAB/AA=±0.07 μm)
SAB ETCH (Dry and Wet NDH110A)
Co_Wet Pre_Clean (Wet NDH25A: Chemical 49% HF: $H_2O$(1:100), temperature 22.5° C. ~23.5° C., 60 seconds)
Salicide Co DEPOSITION (Pre-clean RF 150 W and remove oxide 30 Å, deposition Cobalt 85 Å)
Salicide TiN DEPOSITION (Cap 200 Å)
RTA1/Selective
Wet Etch/RTA2 (RTA1: 500° C.; RTA2: 850° C.)

In another embodiment, to form the insulation layer 2822, a photolithography is performed to pattern the SAB layer. The SAB photo mask is aligned to Active Area (AA) layer mark, for example, OVERLAY SAB/AA=±0.07 μm. After the photolithography, the SAB layer is etched by plasmas dry etch and then wet etch. For example, the wet etch process uses the chemical 49% HF: $H_2O$ (1:100) solvent at the temperature of 22.5° C.~23.5° C. for 270 seconds.

Figure 25:
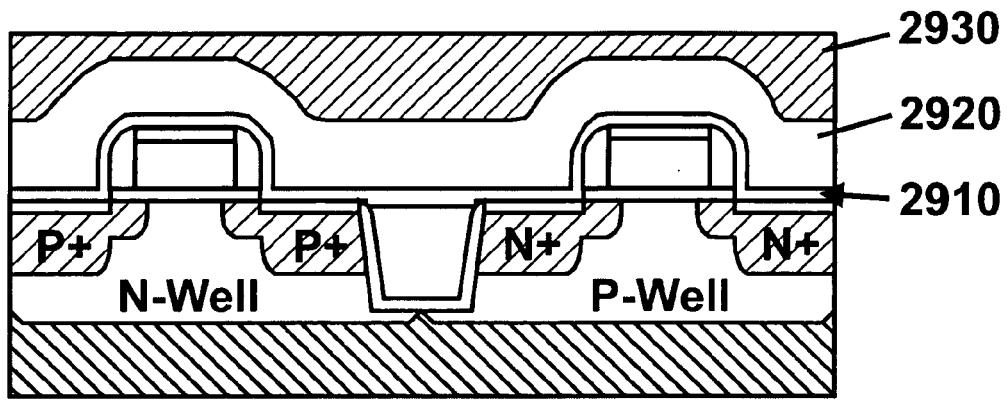
FIG. 25 shows a simplified method for forming inter-layer dielectric layer for making split dual gate field effect transistor according to an embodiment of the present invention.

At the process 2145, one or more inter-layer dielectric layer is formed. FIG. 25 shows a simplified method for forming inter-layer dielectric layer for making split dual gate field effect transistor according to an embodiment of the present invention. This diagram is merely an example, which should not unduly limit the scope of the claims. One of ordinary skill in the art would recognize many variations, alternatives, and modifications.

As shown in FIG. 25, a silicon oxynitride layer 2910 is formed to cover at least part of the structure that results from the process 2140. Additionally, a BPSG layer 2920 is deposited on the silicon oxynitride layer 2910 and undergoes a reflow process. On the BPSG layer 2920, an oxide layer 2930 is formed and planarized by a CMP process.

In one embodiment, the following processes are performed:
PE-SION DEPOSITION (400 Å ETCH Stop Layer)
Scrubber Clean
BPSG DEPOSITION/Reflow/CR Clean (2K/0650BPF30M)
PETEOS DEPOSITION (10.5 KÅ)
Oxide CMP for ILD (Post CMP THICKNESS 7.5 KÅ±1KÅ)

Figure 26:
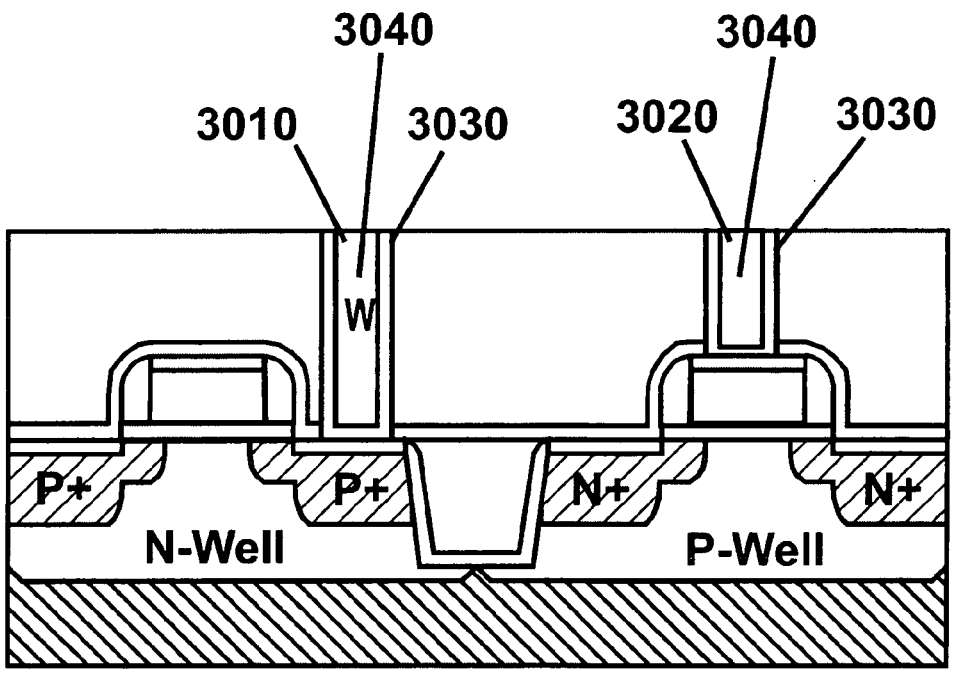
FIG. 26 shows a simplified method for forming contact layer for making split dual gate field effect transistor according to an embodiment of the present invention.

At the process 2150, one or more contact layers are formed. FIG. 26 shows a simplified method for forming contact layer for making split dual gate field effect transistor according to an embodiment of the present invention. This diagram is merely an example, which should not unduly limit the scope of the claims. One of ordinary skill in the art would recognize many variations, alternatives, and modifications.

As shown in FIG. 26, one or more contact holes are formed. For example, contact holes 3010 and 3020 expose the salicide layer 2814 and the salicide layer on the polysilicon gate region 2432. In one embodiment, the polysilicon gate region 2432 is etched to become dual gate regions at the process 2135. In another embodiment, the polysilicon gate region 2432 is not etched to become dual gate regions at the process 2135. In the contact holes, a layer 3030 is formed to cover the bottom surfaces and side surfaces. For example, the layer 3030 includes Ti and TiN. Afterwards, the contact holes are filled by tungsten material 3040.

In one embodiment, the following processes are performed:
CONTACT_PHOTO DARC (Oxide 200 Å and SiON 600 Å)
CONTACT PHOTO (OVERLAY/CD: ±0.045 Åm, 0.235 Åm)
CONTACT ETCH (0.235 Åm)
CONTACT Glue layer (Pre-clan 100 Å, Ti 200 Å, TiN 1×50 Å)
Glue Anneal (0690RTA60S)
Tungsten Plug (W) DEPOSITION (W3.3KÅ bulk deposition 415° C.)

Figure 27A:
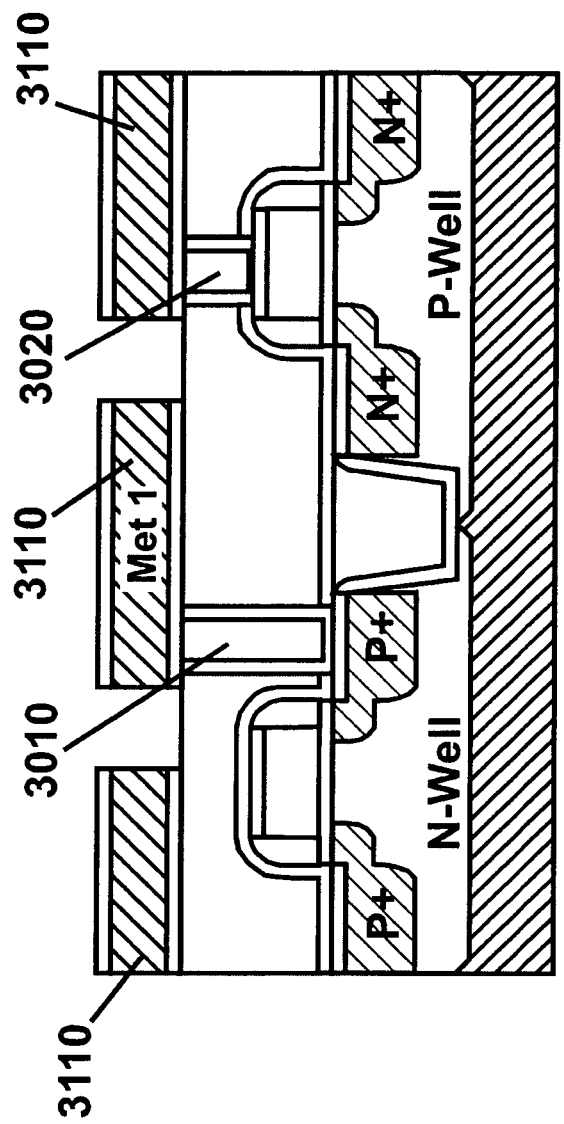
FIGS. 27(A) and (B) show a simplified method for forming metal layer for making split dual gate field effect transistor according to an embodiment of the present invention.
Figure 27B:
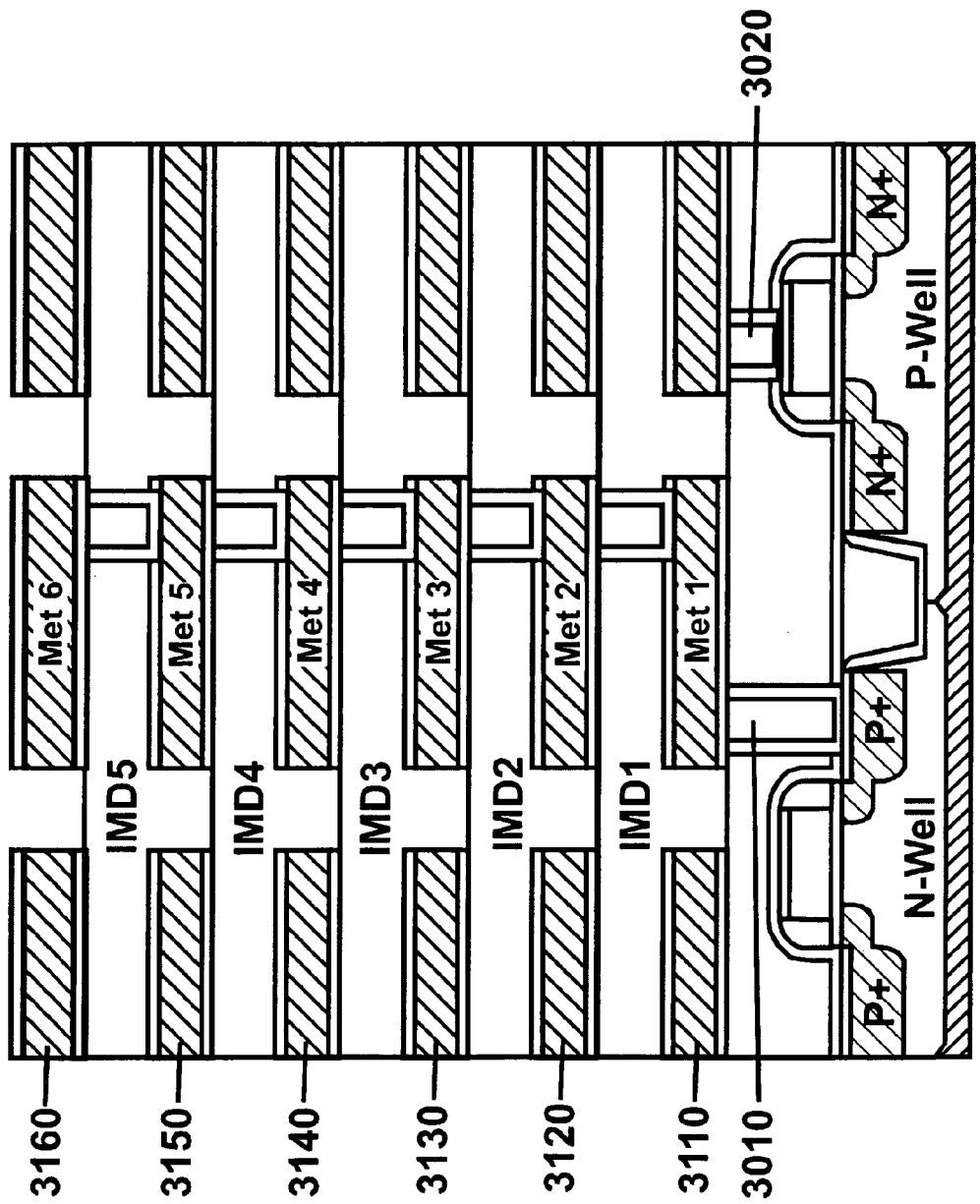

At the process 2155, one or more metal layers are formed. FIGS. 27(A) and (B) show a simplified method for forming metal layer for making split dual gate field effect transistor according to an embodiment of the present invention. These diagrams are merely examples, which should not unduly limit the scope of the claims. One of ordinary skill in the art would recognize many variations, alternatives, and modifications.

As shown in FIGS. 27(A) and (B), one or more metal layers are formed. For example, a metal layer 3110 is in contact with the contact holes 3010 and 3020 filled with the tungsten material 3040. In another example, at least one of the additional metal layers 3120, 3130, 3140, 3150, and 3160 are also formed. The different metal layers are separated by at least an inter-metal dielectric layer. The inter-metal dielectric layer is punched through to form one or more conductive plugs, which provide conductive connections between the metal layers.

In one embodiment, the following processes are performed to form a metal layer:

METAL1 Sputter (Ti/TiN/AlCu/Ti/TiN: THICKNESS 100 Å/200 Å/4KÅ/50 Å/300 Å) (for example, Ti for better $TiO_2$ adhesion; in another example, TiN to prevent $TiAl_3$)
Scrubber
METAL1_PHOTO DARC (320 Å SiON)
Scrubber
METAL1 PHOTO (0.22±0.015)
METAL1 ETCH (0.24±0.02)

In another embodiment, at least the following additional processes are performed to form additional metal layers:
IMD Linear OX DEPOSITION (SRO_500 Å)
IMD HDP FGS OX (SRO_100 Å and 6 KÅ)
IMD PEFSG OX (11.5 KÅ)
IMD CMP (Post THICKNESS 6.5 KÅ±1.2 KÅ)
USG DEPOSITION (2 KÅ)
VIA1~Top Via PHOTO (0.26 μm, 0.39 μm)
VIA1~Top Via ETCH (0.26 μm, 0.39 μm)
M2~TOP Metal PHOTO (0.26 μm, 0.49 μm)
M2~TOP Metal ETCH (0.28 μm, 0.51 μm)

Figure 28:
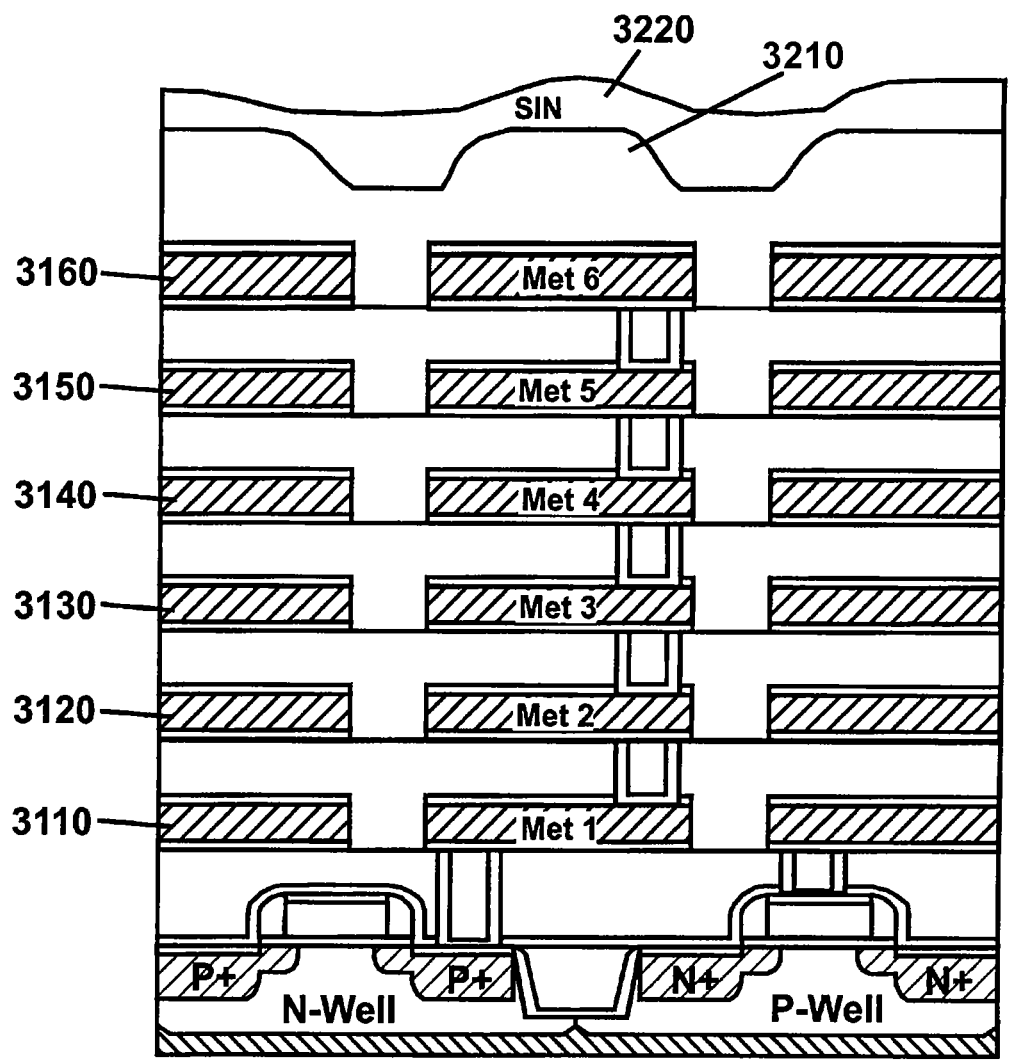
FIG. 28 shows a simplified method for forming passivation layer for making split dual gate field effect transistor according to an embodiment of the present invention.

At the process 2160, one or more passivation layers are formed. FIG. 28 shows a simplified method for forming passivation layer for making split dual gate field effect transistor according to an embodiment of the present invention. This diagram is merely an example, which should not unduly limit the scope of the claims. One of ordinary skill in the art would recognize many variations, alternatives, and modifications.

As shown in FIG. 28, one or more passivation layers are formed. For example, an oxide layer 3210 is formed on at least a metal layer, such as the metal layer 3160. In another example, a nitride layer 3220 is also formed on the oxide layer 3210.

In one embodiment, the following processes are performed to form a metal layer:
Passivation HDP Oxide DEPOSITION 10 KÅ
Passivation Nitride DEPOSITION 6 KÅ

FIGS. 29(A) and (B) show a simplified method for making split dual gate field effect transistor according to another embodiment of the present invention. This diagram is merely an example, which should not unduly limit the scope of the claims herein. The method 3300 includes some or all of the 168 processes. Although FIGS. 29(A) and (B) have been shown using a selected sequence of processes, there can be many alternatives, modifications, and variations. For example, some of the processes may be expanded and/or combined. Other processes may be inserted to those noted above. Depending upon the embodiment, the specific sequence of processes may be interchanged with others replaced. Some of the processes may be expanded and/or combined, and/or other processes may be inserted to those noted above. For example, the split dual gate field effect transistor made by the method 3300 is the device 100.

The present invention has various advantages. Some embodiments of the present invention provide a new planar split dual gate transistor device. Certain embodiments of the present invention provide dual gates that can be biased independently. For example, the independent gate biases can provide dynamical control of the device characteristics such as threshold voltage, sub-threshold swing, and/or the saturation drain current. Some embodiments of the present invention can significantly reduce transistor leakage current. For example, the reduction can reach about 67%. In another example, the reduction can reach about 75%. Certain embodiments of the present invention can provide adjustable threshold voltage without varying gate oxide thickness or doping profile. Some embodiments of the present invention provide an energy band that varies along all three dimensions.

It is also understood that the examples and embodiments described herein are for illustrative purposes only and that various modifications or changes in light thereof will be suggested to persons skilled in the art and are to be included within the spirit and purview of this application and scope of the appended claims.

What is claimed is:

1. A semiconductor device with at least two gate regions, the device comprising:
   a substrate region including a surface, the substrate being characterized by a first conductivity type;
   a source region in the substrate region;
   a drain region in the substrate region, the drain region and the source region being separate from each other, the drain region and the source region being characterized by a second conductivity type opposite the first conductivity type;
   three channel regions disposed in parallel between the source region and the drain region and forming a contiguous region having a same doping concentration, wherein a first channel region and a second channel region are disposed on either side of a third channel region, each of the three channel regions having a first end region contacting the source region and a second end region contacting the drain region, wherein the first channel region, the second channel region, and the third channel region are characterized by a same width;
   a gate dielectric region on the substrate region, the gate dielectric region overlying the three channel regions;
   a first gate region overlying a first portion of the gate dielectric region that overlies the first channel region;
   a second gate region overlying a second portion of the gate dielectric region that overlies the second channel region;
   an insulation region overlying a third portion of the gate dielectric region that overlies the third channel region, the insulation region being disposed between the first gate region and the second gate region, the insulation region extending from the source region to the drain region, the insulation region having a first side surface perpendicular to the surface of the substrate region and in direct contact with the first gate region and a second side surface perpendicular to the surface of the substrate region and in direct contact with the second gate region;
   a first control voltage signal coupled to the first gate region;
   a second control voltage signal coupled to the second gate region, the second control voltage signal being different from the first control voltage signal; and
   a threshold voltage modulated by the first and second control voltage signals;
   whereby the first gate region and the second gate region are configured to be controlled independently to determine a current between the source region and the drain region.

2. The device of claim 1 comprising a transistor including the source region, the drain region, the first gate region, and the second gate region, the transistor being without blocking implant impurities in the third channel region that blocks current flow between the first channel region and the second channel region.

3. The device of claim 1 and further comprising a first dielectric layer, the first dielectric layer being directly on the surface, the first gate region being directly on the first dielectric layer.

4. The device of claim 3 and further comprising a second dielectric layer, the second dielectric layer being directly on the surface, the second gate region being directly on the second dielectric layer.

5. The device of claim 4 wherein the first dielectric layer and the second dielectric layer are a first part and a second part of a dielectric layer, respectively.

6. The device of claim 5 wherein:
   the dielectric layer is directly on the surface;
   the insulation region is directly on the dielectric layer.

7. The device of claim 1 and further comprising:
   a first spacer region, the first spacer region being in direct contact with the first gate region, the second gate region, and the insulation region;
   a second spacer region, the second spacer region being in direct contact with the first gate region, the second gate region, and the insulation region.

8. The device of claim 7 wherein:
   each of the first spacer region and the second spacer region is located on the surface;
   the first spacer region and the second spacer region are not in direct contact to each other.

9. The device of claim 1 wherein the substrate region comprises a semiconductor material.

10. The device of claim 9 wherein the semiconductor material is silicon.

11. The device of claim 1 wherein each of the source region and the drain region is doped to n-type.

12. The device of claim 1 wherein each of the source region and the drain region is doped to p-type.

13. The device of claim 1 wherein the first gate region comprises polysilicon.

14. The device of claim 1 wherein the first channel is associated with a first channel length, the first channel length ranging from 10 nm to 10,000 nm.

15. The device of claim 14 wherein the first channel length is approximately equal to 0.18 μm.

16. The device of claim 1 wherein the insulation region comprises a dielectric material.

17. The device of claim 16 wherein the dielectric material is selected from a group consisting of silicon oxide, silicon nitride, and silicon oxynitride.

18. The device of claim 1 wherein the insulation region is associated with a width in a direction from the first gate region to the second gate region, the width ranging from 10 nm to 10,000 nm.

19. A semiconductor transistor with at least two gate regions, the transistor comprising:
   a substrate region including a surface, the substrate being characterized by a first conductivity type;
   a source region in the substrate region;
   a drain region in the substrate region, the drain region and the source region being separate from each other, the drain region and the source region being characterized by a second conductivity type opposite the first conductivity type;
   three channel regions disposed in parallel between the source region and the drain region and forming a contiguous region, wherein a first channel region and a second channel region are disposed on either side of a third channel region, each of the three channel regions having a first end region contacting the source region and a second end region contacting the drain region, wherein the third channel region is without blocking implant impurities that block current flow between the first channel region and the second channel region, wherein the first channel region and the third channel region are characterized by a same width;
   a gate dielectric region on the substrate region, the gate dielectric region overlying the three channel regions;

a first gate region overlying a first portion of the gate dielectric region that overlies the first channel region;

a second gate region overlying a second portion of the gate dielectric region that overlies the second channel region;

an insulation region overlying a third portion of the gate dielectric region that overlies the third channel region, the insulation region being disposed between the first gate region and the second gate region, the insulation region extending from the source region to the drain region, the insulation region having a first side surface perpendicular to the surface of the substrate region and in direct contact with the first gate region and a second side surface perpendicular to the surface of the substrate region and in direct contact with the second gate region;

a first spacer region, the first spacer region being in contact with the first gate region, the second gate region, and the insulation region;

a second spacer region, the second spacer region being in contact with the first gate region, the second gate region, and the insulation region;

a first bias voltage coupled to the first gate region;

a second bias voltage coupled to the second gate region, the second bias voltage being different from the first bias voltage signal; and a threshold voltage modulated by the first and second bias voltages.

20. The transistor of claim 19 and further comprising a first dielectric layer, the first dielectric layer being directly on the surface, the first gate region being directly on the first dielectric layer.

21. The transistor of claim 20 and further comprising a second dielectric layer, the second dielectric layer being directly on the surface, the second gate region being directly on the second dielectric layer.

22. The transistor of claim 21 wherein the first dielectric layer and the second dielectric layer are a first part and a second part of a dielectric layer respectively.

23. The transistor of claim 22 wherein:
the dielectric layer is directly on the surface;
the insulation region is directly on the dielectric layer.

24. The transistor of claim 19 wherein:
each of the first spacer region and the second spacer region is located on the surface;
the first spacer region and the second spacer region are not in direct contact to each other.

* * * * *